(12) United States Patent
Choi et al.

(10) Patent No.: US 10,339,845 B2
(45) Date of Patent: Jul. 2, 2019

(54) TRANSPARENT DISPLAY DEVICE AND TRANSPARENT DISPLAY PANEL

(71) Applicant: LG Display Co., Ltd., Seoul (KR)

(72) Inventors: JeongHyeon Choi, Seoul (KR); JaeHee Park, Gyeongsangbuk-do (KR); Joonsoo Han, Gyeonggi-do (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 15/277,153

(22) Filed: Sep. 27, 2016

(65) Prior Publication Data

US 2017/0092166 A1 Mar. 30, 2017

(30) Foreign Application Priority Data

Sep. 30, 2015 (KR) .......................... 10-2015-0138242

(51) Int. Cl.
*G09G 3/00* (2006.01)
*G09G 3/20* (2006.01)
*G09G 3/3225* (2016.01)

(52) U.S. Cl.
CPC ........... *G09G 3/006* (2013.01); *G09G 3/2003* (2013.01); *G09G 3/2096* (2013.01);
(Continued)

(58) Field of Classification Search
CPC ............... G09G 3/006; G09G 2330/04; G09G 2330/08–12; G09G 2300/0413; G09G 2300/0426; G02F 1/1309; G02F 1/136259; G02F 2001/136263–136272; H04N 17/00; H04N 17/04; H01L 2251/568; H01L 27/3244–3279
See application file for complete search history.

(56) References Cited

U.S. PATENT DOCUMENTS 9,767,732 B2 * 9/2017 Park .................... G09G 3/3258
2002/0158996 A1 10/2002 Kim et al.
2008/0170167 A1 * 7/2008 Su ..................... G02F 1/136259
349/38
(Continued)

FOREIGN PATENT DOCUMENTS

CN      104752635 A     7/2015
JP      2010-097230 A   4/2010
KR      10-2013-0077205 A  7/2013

OTHER PUBLICATIONS

Chinese Office Action dated Dec. 18, 2018 from the Chinese Patent Office for counterpart Chinese patent application No. 201610875170.3.

*Primary Examiner* — Roberto W Flores
(74) *Attorney, Agent, or Firm* — Morgan, Lewis & Bockius LLP

(57) ABSTRACT

Disclosed are a transparent display panel and a transparent display device, which each include a plurality of data lines, a plurality of gate lines, and a plurality of transparent pixels each including a plurality of subpixels which display different colors and are disposed adjacent to each other in a first direction and a transparent area disposed adjacent to a corresponding subpixel in a second direction, thereby enabling a pixel defect such as a dark spot or a hot spot to be repaired and enabling normal driving. To this end, the transparent display panel and the transparent display device each include a repair line overlapping a first transparent pixel and a second transparent pixel adjacent to each other in the second direction in the plurality of transparent pixels.

21 Claims, 17 Drawing Sheets

(52) U.S. Cl.
CPC ............. *G09G 3/3225* (2013.01); *G09G 3/20* (2013.01); *G09G 2300/0426* (2013.01); *G09G 2300/0452* (2013.01); *G09G 2330/08* (2013.01); *G09G 2330/10* (2013.01)

(56) References Cited

U.S. PATENT DOCUMENTS

| | | | |
|---|---|---|---|
| 2013/0048990 A1 | 2/2013 | Park et al. | |
| 2014/0111504 A1* | 4/2014 | Lee | G09G 3/3607 345/214 |
| 2014/0292827 A1* | 10/2014 | Kang | G09G 3/20 345/690 |
| 2014/0346475 A1* | 11/2014 | Cho | H01L 27/326 257/40 |
| 2015/0048999 A1* | 2/2015 | Hsieh | G06F 3/1423 345/1.1 |
| 2015/0108437 A1* | 4/2015 | Cho | H01L 27/3248 257/40 |
| 2015/0187249 A1 | 7/2015 | Tani et al. | |
| 2015/0228217 A1* | 8/2015 | Perdices-Gonzalez | G09G 3/348 345/5 |
| 2015/0294618 A1* | 10/2015 | Park | G09G 3/3233 345/214 |
| 2015/0294620 A1* | 10/2015 | Cho | G09G 3/3233 345/690 |
| 2015/0364531 A1* | 12/2015 | Kim | H01L 27/3276 257/40 |
| 2016/0055794 A1* | 2/2016 | Lee | G09G 3/3275 345/212 |
| 2016/0155791 A1* | 6/2016 | Kim | H01L 27/3276 257/40 |
| 2016/0189644 A1* | 6/2016 | So | G09G 3/3233 345/205 |
| 2016/0233286 A1* | 8/2016 | Kim | H01L 27/3276 257/40 |
| 2016/0268364 A1* | 9/2016 | Yin | G09G 3/3233 |
| 2016/0379535 A1* | 12/2016 | Park | G09G 3/006 345/211 |

* cited by examiner

FIG. 18
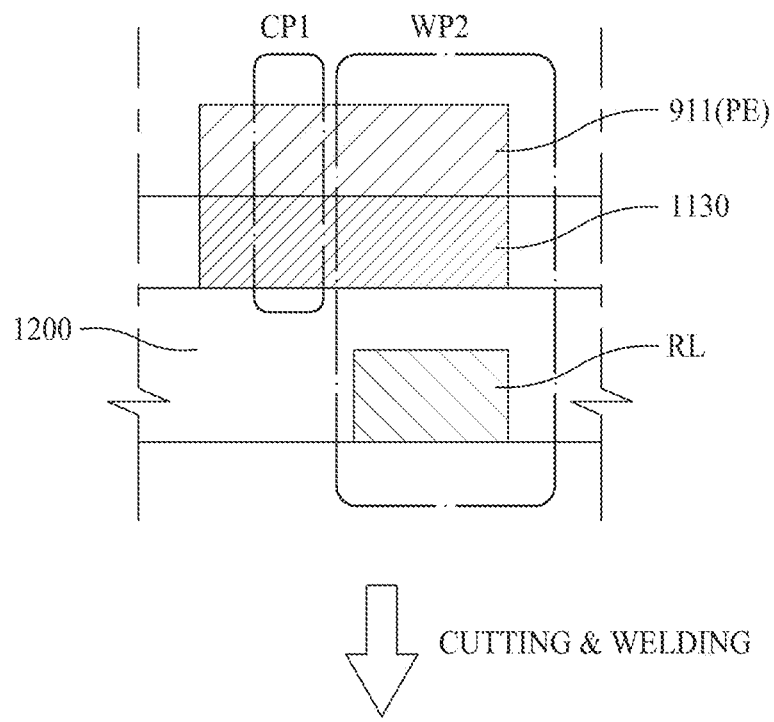
CUTTING & WELDING
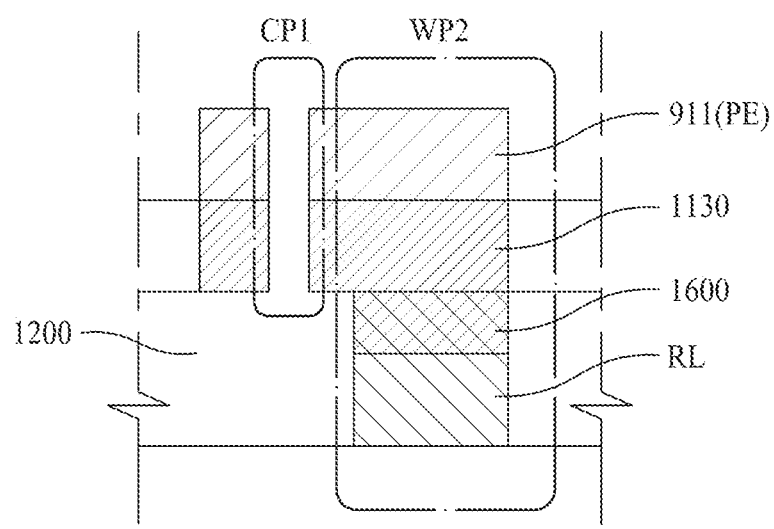

TRANSPARENT DISPLAY DEVICE AND TRANSPARENT DISPLAY PANEL

CROSS-REFERENCE TO RELATED APPLICATIONS

This application claims the benefit of the Korean Patent Application No. 10-2015-0138242 filed on Sep. 30, 2015, which is hereby incorporated by reference as if fully set forth herein.

BACKGROUND

Field of the Invention

The present invention relates to a transparent display device and a transparent display panel.

Discussion of the Related Art

With the advancement of information-oriented society, various requirements for display devices for displaying an image are increasing. Recently, various display devices such as liquid crystal display (LCD) devices, plasma display devices, organic light emitting display devices, etc. are being used.

Recently, transparent display devices having transparency unlike related art display devices are being developed. However, research and development for providing transparency focus on replacing elements of display panels with transparent elements. For this reason, transparent display panels and transparent display devices are not efficiently implemented.

Moreover, a related art repair structure and a related art repair method for repairing a defective pixel has been developed to be suitable for only related art display devices having no transparency. For this reason, in transparent display panels, when a defective pixel occurs, the related art repair structure and the related art repair method are not suitable for repairing the defective pixel.

SUMMARY

Accordingly, the present invention is directed to provide a transparent display device and a transparent display panel that substantially obviate one or more problems due to limitations and disadvantages of the related art.

An object of the present invention is to provide a transparent display panel and a transparent display device, which are high in degree of transparency.

Another object of the present invention is to provide a transparent display panel and a transparent display device, which have a transparent pixel structure.

Another object of the present invention is to provide a repair structure and a repair treatment method, which are suitable for a transparent pixel structure.

Another object of the present invention is to provide a transparent display panel and a transparent display device, for which repair has been performed.

Another object of the present invention is to provide a transparent display panel and a transparent display device, which are high in yield rate.

Additional features and advantages of the invention will be set forth in the description that follows, and in part will be apparent from the description, or may be learned by practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, a transparent display panel and a transparent display device each comprises a plurality of data lines and a plurality of gate lines, a plurality of transparent pixels each including a plurality of subpixels which display different colors and are disposed adjacent to each other in a first direction and a transparent area disposed adjacent to a corresponding subpixel in a second direction, and a repair line overlapping a first transparent pixel and a second transparent pixel adjacent to each other in the second direction in the plurality of transparent pixels.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings:

FIG. 18 is a diagram illustrating a cutting and welding operation performed at a cutting and welding point in repairing a defective transparent pixel, in a transparent display device according to an embodiment;

DETAILED DESCRIPTION

Figure 1:
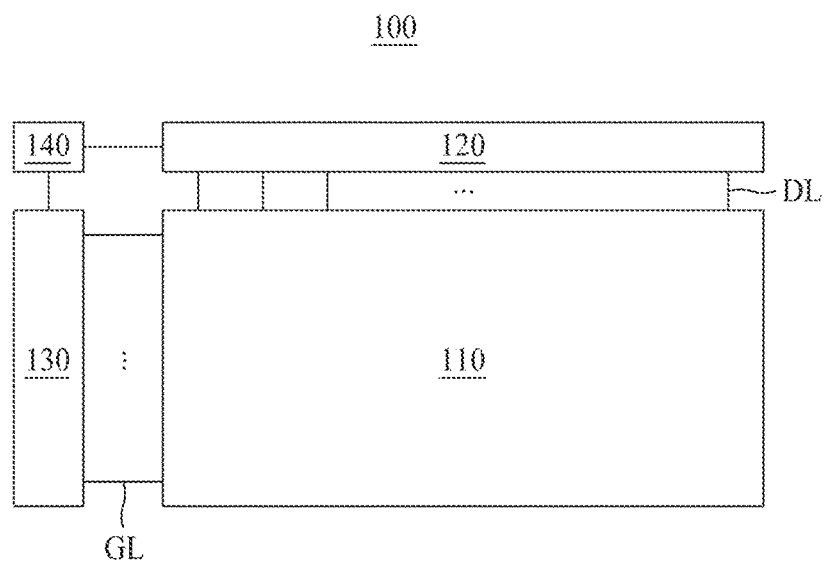
FIG. 1 is a block diagram illustrating a schematic system configuration of a transparent display device according to an embodiment.

Reference will now be made in detail to the exemplary embodiments of the present invention, examples of which are illustrated in the accompanying drawings. Wherever possible, the same reference numbers will be used throughout the drawings to refer to the same or like parts.

Hereinafter, some embodiments of the present invention will be described in detail with reference to the accompanying drawings. In the specification, in adding reference numerals for elements in each drawing, it should be noted that like reference numerals already used to denote like elements in other drawings are used for elements wherever possible. In the following description, when the detailed description of the relevant known function or configuration is determined to unnecessarily obscure the important point of the present invention, the detailed description will be omitted.

In describing the elements of the present invention, terms such as first, second, A, B, (a), (b), etc., may be used. Such terms are used for merely discriminating the corresponding elements from other elements and the corresponding elements are not limited in their essence, sequence, or precedence by the terms. It will be understood that when an element or layer is referred to as being "on" or "connected to" another element or layer, it can be directly on or directly connected to the other element or layer, or intervening elements or layers may be present.

FIG. 1 is a block diagram illustrating a schematic system configuration of a transparent display device 100 according to an embodiment.

Referring to FIG. 1, the transparent display device 100 according to an embodiment may include a transparent display panel 110 where a plurality of gate lines, a plurality of data lines, and a plurality of transparent pixels are provided, a data driver 120 that respectively outputs data voltages to the plurality of data lines to drive the data lines, a gate driver 130 that sequentially outputs a scan signal to the plurality of gate lines to drive the gate lines, and a timing controller 140 that outputs various control signals to control the data driver 120 and the gate driver 130.

The data driver 120 may include a plurality of data driving integrated circuits (ICs, referred to as a source driving IC).

The plurality of data driving ICs may be connected to a bonding pad of the transparent display panel 110 in a tape automated bonding (TAB) type or a chip-on glass (COG) type, or may be directly provided in the transparent display panel 110. Depending on the case, the data driving ICs may be integrated into the transparent display panel 110.

Depending on a driving type, the gate driver 130 may be disposed on only one side of the transparent display panel 110 as illustrated in FIG. 1, or the gate driver 130 may be provided as two and may be disposed on both sides of the transparent display panel 110. Also, the gate driver 130 may include a plurality of gate driving ICs, and the gate driving ICs may be connected to the bonding pad of the transparent display panel 110 in the TAB type or the COG type. Alternatively, the gate driving ICs may be implemented in a gat-in panel (GIP) type and may be directly provided in the transparent display panel 110. Depending on the case, the gate driving ICs may be integrated into the transparent display panel 110.

In the present embodiment, a new transparent pixel structure is proposed, and thus, the transparent display panel 110 and the transparent display device 100 are provided.

The transparent pixel structure, which is newly configured for implementing the transparent display panel 110 and the transparent display device 100, has a structural feature where subpixels having the same color are not adjacent to each other.

When a defect occurs in a transistor or a pixel electrode included in one subpixel due to a feature of the transparent pixel structure, a limited case where repair cannot be performed by using adjacent subpixels occurs.

On the other hand, in the present embodiment, a repair structure for repairing a defective pixel even in a transparent pixel structure is provided. Here, the repair may be performed in a process of manufacturing a panel before releasing a product, and after the product is released, the repair may be performed according to an after-service request of a consumer.

Hereinafter, a transparent pixel structure for implementing the transparent display panel 110 and the transparent display device 100 and a repair structure and a repair method for performing repair in the transparent pixel structure will be described in detail with reference to the drawings.

Figure 2:
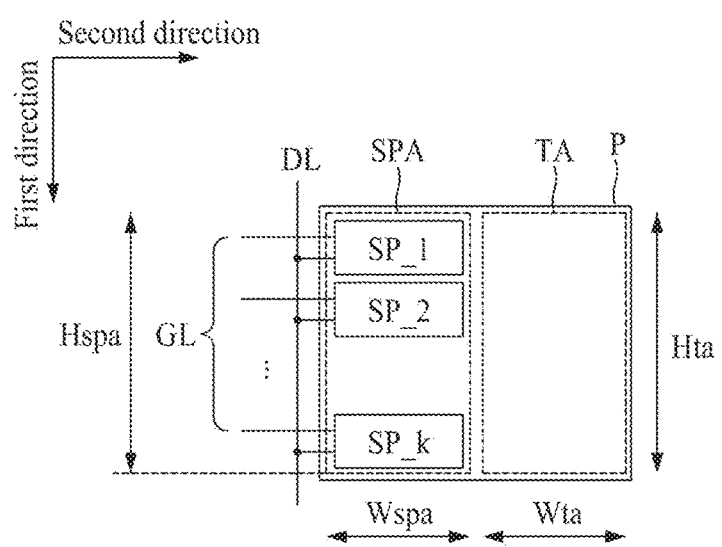
FIGS. 2 and 3 are diagrams illustrating a generalized transparent pixel structure of a transparent display device according to an embodiment.
Figure 3:
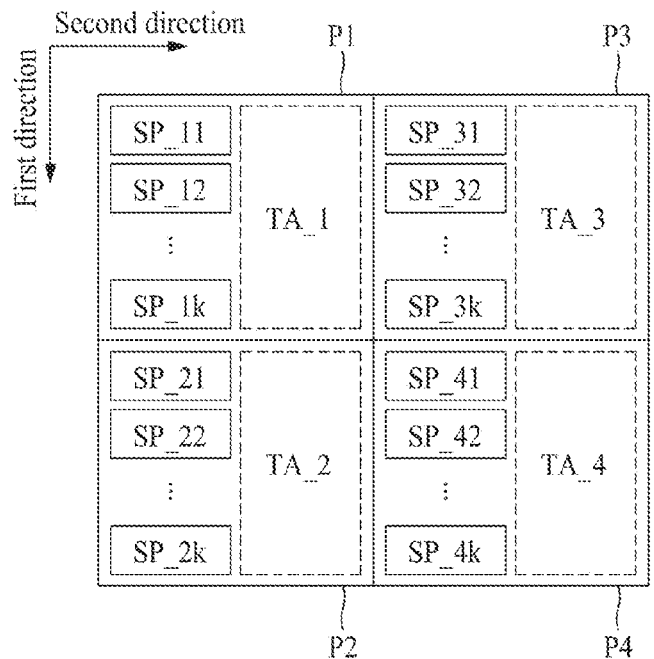

FIGS. 2 and 3 are diagrams illustrating a generalized transparent pixel structure of a transparent display device according to an embodiment. FIG. 2 is a diagram illustrating a generalized transparent pixel structure of one pixel, and FIG. 3 is a diagram illustrating four transparent pixels.

Referring to FIG. 2, one transparent pixel P may include a transparent area TA and a subpixel area SPA where k number of subpixels $SP\_1$, $SP\_2$, ..., and $SP\_k$ displaying different colors are provided. Here, k denoting the number of subpixels included in the one transparent pixel P may be three or four, and depending on the case, k may be a natural number equal to two or equal to or more than five.

Referring to FIG. 2, in the one transparent pixel P, the subpixels $SP\_1$, ..., and $SP\_k$ may be disposed adjacent to each other in a first direction.

Referring to FIG. 2, the transparent area TA may be disposed adjacent to the subpixel area SPA in a second direction. That is, the transparent area TA may be disposed adjacent to the subpixels $SP\_1$, ..., and $SP\_k$ in the second direction.

As described above, a plurality of transparent pixels P may each include the transparent area TA, and thus, may each have a transparent structure. Due to such a transparent pixel structure, the transparent display panel 110 and the transparent display device 100 according to an embodiment are implemented.

Referring to FIG. 2, for example, in each of the transparent pixels P, a height Hta of the transparent area TA may correspond to or may be similar to a height Hspa of the subpixel area SPA, and a width Wta of the transparent area TA may be narrower than, wider than, or equal to a width Wspa of the subpixel area SPA. Here, a ratio "Ata/Aspa" of a size "Ata=Wta×Hta" of the transparent area TA to a size "Aspa=Wspa×Hspa" of the subpixel area SPA which are determined based on a width W and a height H may be determined based on at least one of a transmittance and a resolution of the transparent display device 100.

Here, as the size Ata of the transparent area TA becomes greater than the size Aspa of the subpixel area SPA, namely, as the ratio "Ata/Aspa" of the size "Ata=Wta×Hta" of the transparent area TA to the size "Aspa=Wspa×Hspa" of the subpixel area SPA becomes higher, a transparency of the transparent pixel P may increase, and moreover, a transparency of the transparent display device 100 may increase.

FIG. 3 is a diagram illustrating four transparent pixels P1 to P4 having the transparent pixel structure of FIG. 2. In FIG. 3, a first transparent pixel P1 and a second transparent pixel P2 may be disposed adjacent to each other in the first direction, a third transparent pixel P3 and a fourth transparent pixel P4 may be disposed adjacent to each other in the first direction, the first transparent pixel P1 and the third transparent pixel P3 may be disposed adjacent to each other in the second direction, and the second transparent pixel P2 and the fourth transparent pixel P4 may be disposed adjacent to each other in the second direction.

Referring to FIG. 3, the first transparent pixel P1 may include k number of subpixels SP_11, SP_12, . . . , and SP_1k, which are disposed adjacent to each other in the first direction in the subpixel area SPA, and a transparent area TA_1 which is disposed adjacent to the subpixel area SPA in the second direction. The second transparent pixel P2 may include k number of subpixels SP_21, SP_22, . . . , and SP_2k, which are disposed adjacent to each other in the first direction in the subpixel area SPA, and a transparent area TA_2 which is disposed adjacent to the subpixel area SPA in the second direction. The third transparent pixel P3 may include k number of subpixels SP_31, SP_32, . . . , and SP_3k, which are disposed adjacent to each other in the first direction in the subpixel area SPA, and a transparent area TA_3 which is disposed adjacent to the subpixel area SPA in the second direction. The fourth transparent pixel P4 may include k number of subpixels SP_41, SP_42, . . . , and SP_4k, which are disposed adjacent to each other in the first direction in the subpixel area SPA, and a transparent area TA_4 which is disposed adjacent to the subpixel area SPA in the second direction.

Referring to FIG. 3, the transparent areas TA_1 and TA_2 of the first and second transparent pixels P1 and P2 which are adjacent to each other in the first direction may be disposed adjacent to each other. Also, the transparent areas TA_3 and TA_4 of the third and fourth transparent pixels P3 and P4 which are adjacent to each other in the first direction may be disposed adjacent to each other.

In this manner, since the transparent areas TA of the respective transparent pixels P are disposed adjacent to each other, a transparency of the transparent display device 100 increases, and moreover, it is easy to implement a repair structure (for example, a repair line, etc.) enabling a defective transparent pixel to be repaired (this will be described below in more detail).

Referring to FIG. 3, in the transparent display device 100 according to an embodiment, two adjacent subpixels may be subpixels of different colors irrespective of the transparent pixel P.

In other words, two adjacent subpixels in one transparent pixel may be subpixels of different colors.

For example, in the first transparent pixel P1, a first subpixel SP_11 and a second subpixel SP_12 may be subpixels of different colors.

Moreover, when two subpixels respectively included in two adjacent transparent pixels are adjacent to each other, the two subpixels may be subpixels of different colors.

For example, a kth subpixel SP_1k of the first transparent pixel P1 may be disposed adjacent to a first subpixel SP_21 of the second transparent pixel P2, and the kth subpixel SP_1k of the first transparent pixel P1 and the first subpixel SP_21 of the second transparent pixel P2 may be subpixels of different colors.

In this manner, two adjacent subpixels among all subpixels may be subpixels of different colors, and thus, when a defect occurs in one subpixel of the subpixels, it is difficult to use a subpixel adjacent to the one subpixel for repairing the one subpixel where the defect occurs.

Therefore, the present embodiment provides a repair structure enabling repair even in a subpixel arrangement structure where a defective subpixel cannot be repaired by using a subpixel adjacent thereto. This will be described below in more detail.

Hereinafter, a transparent pixel arrangement structure according to an embodiment described above with reference to FIGS. 2 and 3 may be applied to a three-subpixel structure and a four-subpixel structure.

First, an example where a transparent pixel arrangement structure according to an embodiment is applied to the three-subpixel structure will be described with reference to FIGS. 4 to 6.

Figure 4:
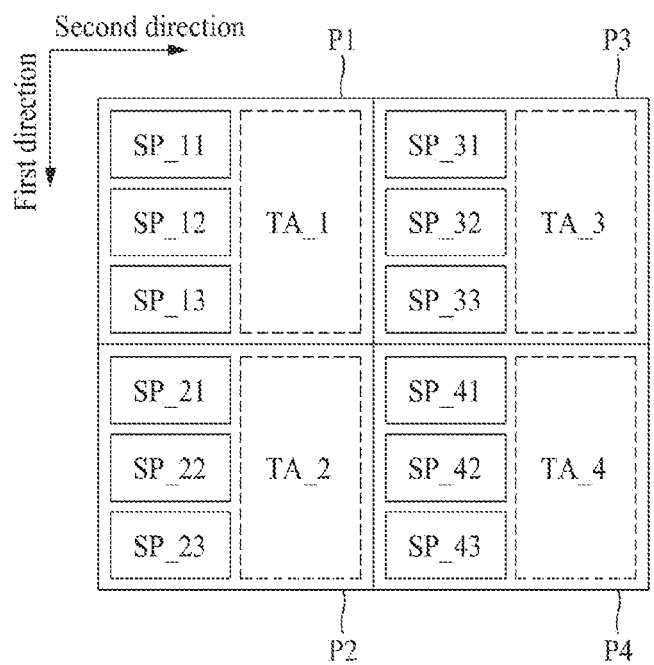
FIGS. 4 to 6 are diagrams illustrating a three-subpixel-based transparent pixel arrangement structure of a transparent display device according to an embodiment.

FIG. 4 is a diagram illustrating a three-subpixel-based transparent pixel arrangement structure of a transparent display device 100 according to an embodiment.

Referring to FIG. 4, in a first transparent pixel P1 and a second transparent pixel P2 which are adjacent to each other in a first direction, subpixels SP_11, . . . , and SP_1k of the first transparent pixel P1 and subpixels SP_21, . . . , and SP_2k of the second transparent pixel P2 may have different color arrays.

Moreover, in a third transparent pixel P3 and a fourth transparent pixel P4 which are adjacent to each other in the first direction, subpixels SP_31, . . . , and SP_3k of the third transparent pixel P3 and subpixels SP_41, . . . , and SP_4k of the fourth transparent pixel P4 may have different color arrays.

Referring to FIG. 4, the subpixels SP_31, . . . , and SP_3k of the third transparent pixel P3 which are adjacent to the first transparent pixel P1 in a second direction and the subpixels SP_21, . . . , and SP_2k of the second transparent pixel P2 which are adjacent to the first transparent pixel P1 in a first direction may have the same color array.

Moreover, the subpixels SP_41, . . . , and SP_4k of the fourth transparent pixel P4 which are adjacent to the second transparent pixel P2 in the second direction and the subpixels SP_11, . . . , and SP_1k of the first transparent pixel P1 which are adjacent to the second transparent pixel P2 in the first direction may have the same color array.

Figure 5:
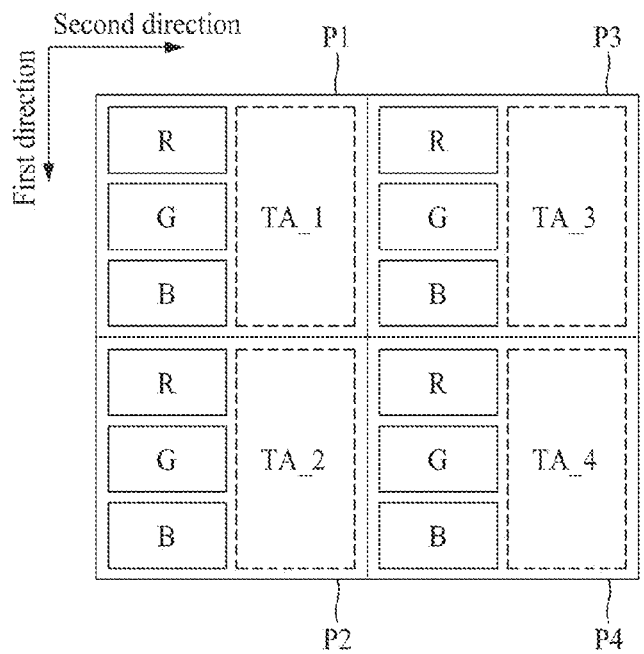

FIG. 5 is an exemplary diagram of the three-subpixel-based transparent pixel arrangement structure.

Referring to FIG. 5, subpixels of respective transparent pixels P1 to P4 may have the same color array.

Referring to FIG. 5, subpixels SP_11, SP_12 and SP_13 of the first transparent pixel P1, subpixels SP_21, SP_22 and SP_23 of the second transparent pixel P2, subpixels SP_31, SP_32 and SP_33 of the third transparent pixel P3, and subpixels SP_41, SP_42 and SP_43 of the fourth transparent pixel P4 may have, for example, a color array where red (R), green (G), and blue (B) are arranged in a predetermined order.

Figure 6:
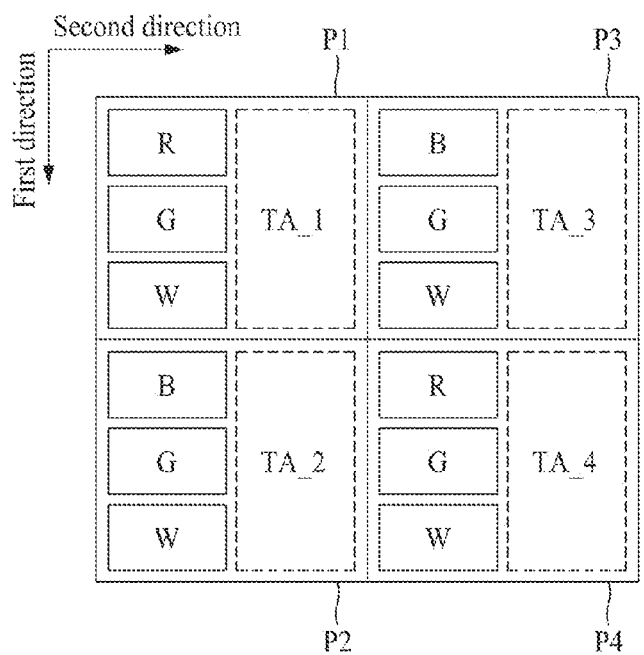

FIG. 6 is another exemplary diagram of the three-subpixel-based transparent pixel arrangement structure.

Referring to FIG. 6, in a first transparent pixel P1 and a fourth transparent pixel P4 which are disposed in a diagonal direction, subpixels SP_11, SP_12 and SP_13 of the first transparent pixel P1 and subpixels SP_41, SP_42 and SP_43 of the fourth transparent pixel P4 may have a color array where red (R), green (G), and white (W) are arranged in a predetermined order.

Referring to FIG. 6, in a second transparent pixel P2 and a third transparent pixel P3 which are disposed in a diagonal direction, subpixels SP_21, SP_22 and SP_23 of the second transparent pixel P2 and subpixels SP_31, SP_32 and SP_33 of the third transparent pixel P3 may have a color array where blue (B), green (G), and white (W) are arranged in a predetermined order.

In other words, in the three-subpixel-based transparent pixel arrangement structure, subpixels of two transparent pixels which are disposed adjacent to each other in a first direction may have different color arrays, and subpixels of two transparent pixels which are disposed in a diagonal direction may have the same color array.

For example, as illustrated in FIG. 6, one of two transparent pixels which are disposed adjacent to each other in the first direction may include a plurality of subpixels having a color array where red (R), green (G), and white (W) are arranged in a predetermined order, and the other transparent pixel may include a plurality of subpixels having a color array where blue (B), green (G), and white (W) are arranged in a predetermined order.

In addition to the color array structure of FIG. 6, one transparent pixel may be configured by arranging a plurality of subpixels corresponding to three colors of red (R), blue (B), green (G), and white (W) according to a predetermined array rule. Here, the array rule denotes that an array pattern of each color is regular.

As described above with reference to FIGS. 4 to 6, the present embodiment provides the three-subpixel-based transparent pixel structure and the transparent display device 100 having a transparent pixel arrangement structure using the same. Therefore, an aperture ratio of the transparent display panel 110 further increases, and the numbers of subpixels, signal lines (for example gate lines), ICs (for example, gate driving ICs), etc. are reduced.

In the transparent pixel arrangement structure of FIG. 6, two adjacent transparent pixels among the plurality of transparent pixels may share one subpixel among a red subpixel, a green subpixel and a blue subpixel. The two adjacent transparent pixels comprises a first color array having one color and a first color array having two colors different to each other. The first color array may have the green subpixel. The second color array may have the red subpixel and the blue subpixel. The two adjacent transparent pixels may share the red subpixel or the blue subpixel in the second direction. The two adjacent transparent pixels further comprises a third color array having one color of a white subpixel. Thus, in the transparent pixel arrangement structure of FIG. 6, since one transparent pixel does not include a subpixel corresponding to each one of red, green, and blue (particularly, red (R) or blue (B)), namely, since the one transparent pixel includes only subpixels respectively corresponding to white and two colors (for example, red and green, or blue and green), a transparent pixel rendering process that enables adjacent transparent pixels to share a specific color may be used.

Next, an example where a transparent pixel arrangement structure according to an embodiment is applied to the four-subpixel structure will be described with reference to FIGS. 7 and 8.

Figure 7:
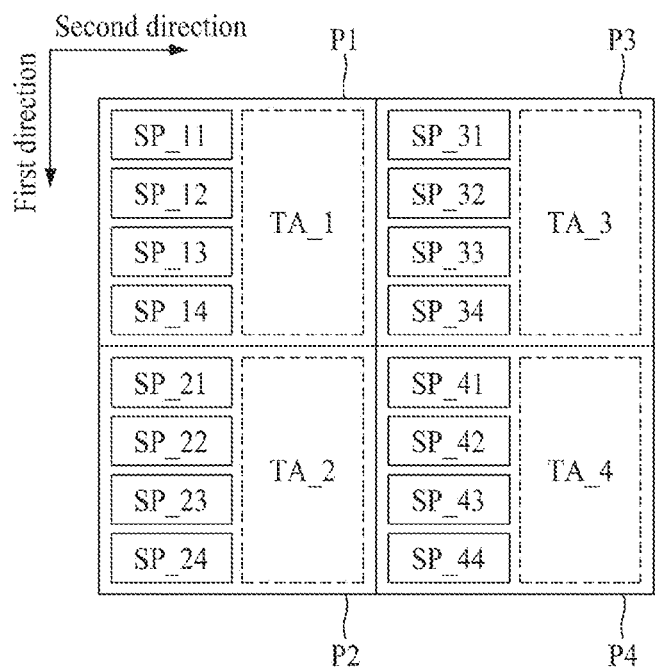
FIGS. 7 and 8 are diagrams illustrating a four-subpixel-based transparent pixel arrangement structure of a transparent display device according to an embodiment.

FIG. 7 is a diagram illustrating a four-subpixel-based transparent pixel arrangement structure of a transparent display device 100 according to an embodiment.

Referring to FIG. 7, subpixels of respective transparent pixels P1 to P4 may have the same color array.

Referring to FIG. 7, in the four-subpixel-based transparent pixel arrangement structure, each of a plurality of transparent pixels may include a plurality of subpixels respectively corresponding to red, green, blue, and white.

Figure 8:
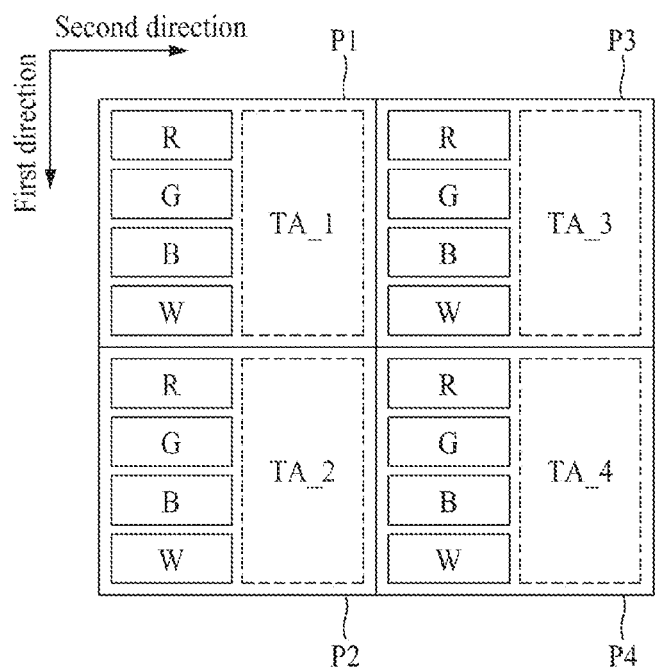

FIG. 8 is an exemplary diagram of the four-subpixel-based transparent pixel arrangement structure.

Referring to FIG. 8, subpixels of each of a plurality of transparent pixels may have a color array where red (R), green (G), blue (B), and white (W) are arranged in a predetermined order.

Referring to FIG. 8, subpixels SP_11 to SP_14 of a first transparent pixel P1 may be subpixels respectively corresponding to red (R), green (G), blue (B), and white (W). Subpixels SP_21 to SP_24 of a second transparent pixel P2 may be subpixels respectively corresponding to red (R), green (G), blue (B), and white (W). Subpixels SP_31 to SP_34 of a third transparent pixel P3 may be subpixels respectively corresponding to red (R), green (G), blue (B), and white (W). Subpixels SP_41 to SP_44 of a fourth transparent pixel P4 may be subpixels respectively corresponding to red (R), green (G), blue (B), and white (W).

As described above with reference to FIGS. 7 and 8, the present embodiment provides the four-subpixel-based transparent pixel structure and the transparent display device 100 having a transparent pixel arrangement structure using the same. Therefore, the transparent display panel 110 more accurately displays colors, and a resolution is further enhanced. Also, since one transparent pixel includes subpixels of all colors, a pixel rendering process may not be performed unlike the transparent pixel arrangement structure of FIG. 6.

Figure 9:
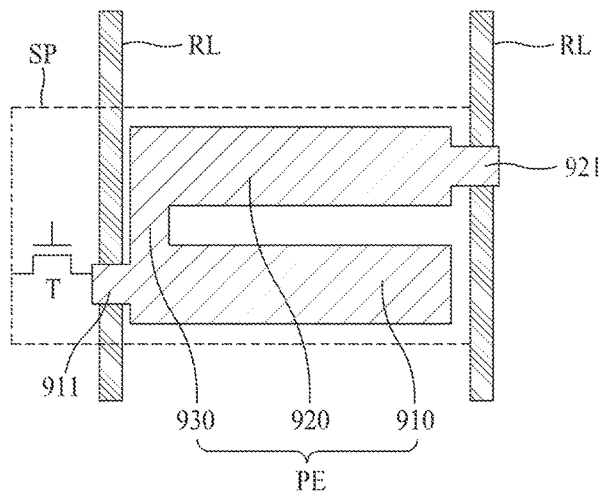
FIG. 9 is a diagram schematically illustrating a subpixel structure in a transparent display device according to an embodiment.

FIG. 9 is a diagram schematically illustrating a subpixel structure in a transparent display device 100 according to an embodiment.

Referring to FIG. 9, in the transparent display device 100 according to an embodiment, a plurality of subpixels SP included in each of a plurality of transparent pixels P may each include at least one transistor T and a pixel electrode PE which is partitioned into a first part 910 and a second part 920 with respect to a connection part 930.

Referring to FIG. 9, in the pixel electrode PE, a part connectable to the transistor T may be the first part 910, and a part opposite thereto may be the second part 920, with respect to the connection part 930.

Referring to FIG. 9, each of the subpixels may have a partition structure where the pixel electrode PE is partitioned into the first part 910 and the second part 920 with respect to the connection part 930. The partition structure may be a structure for performing repair.

For example, when a defect occurs in the first part 910 which is a part connectable to the transistor T, a corresponding transparent pixel P may be repaired by cutting the connection part 930.

Therefore, in the pixel electrode PE, the connection part 930 may be a cutting point CP which is to be cut for repair (cutting).

Referring to FIG. 9, two repair lines RL for repairing a defective pixel may be provided in a first direction near each of a plurality of subpixels SP included in each of the transparent pixels P.

Due to a pixel electrode structure and a repair structure illustrated in FIG. 9, repair is accurately and easily performed.

Moreover, even in a transparent pixel arrangement structure where subpixels of different colors are adjacent to each other, repair may be performed through repair lines RL.

Referring to FIG. 9, a first protrusion 911 protruding to on a repair line RL may be provided in the first part 910 of the pixel electrode PE.

Referring to FIG. 9, the first part 910 of the pixel electrode PE may be connected to or cut from the transistor T, and a portion of the first part 910 cut from the transistor T may be repaired (welded) with the repair line RL.

Before repair is performed, the first protrusion 911 may be connected to the transistor T and may be electrically insulated from the repair line RL. After the repair is performed, the first protrusion 911 may be cut for disconnecting the transistor T from the pixel electrode PE, or a portion of the first protrusion 911 which is cut for disconnecting the transistor T from the pixel electrode PE may be welded for an electrical connection with the repair line RL.

Therefore, the first protrusion 911 which is provided in the first part 910 of the pixel electrode PE may be a cutting point CP which is to be cut for repair, and may also be a welding point WP which is to be welded.

Referring to FIG. 9, a second protrusion 921 protruding to on a repair line RL may be provided in the second part 920 of the pixel electrode PE.

The second protrusion 921 may be initially provided with being spaced apart from the repair line RL.

In a subpixel SP including the pixel electrode PE where the second protrusion 921 is provided, when a defect occurs in another subpixel SP and thus the other subpixel PS is repaired, the second protrusion 921 may be electrically connected to the repair line RL.

Therefore, likewise with the first protrusion 911, the second protrusion 921 provided in the second part 920 of the pixel electrode PE may be a welding point WP which is to be welded for repair (welding).

As described above with reference to FIG. 9, since the pixel electrode PE includes the partition structure and the structure including the first and second protrusions 911 and 921, repair is more easily and accurately performed. Also, when a defect occurs in one of the first part and the second part, the other part may be normally used by using various repair methods.

Referring to FIG. 9, in the pixel electrode PE, a width of each of the connection part 930, the first protrusion 911, and the second protrusion 921 may be narrower than a width of another part of the pixel electrode PE.

Moreover, the pixel electrode PE may be partitioned into the first part 910 including the first protrusion 911 and the second part 920 including the second protrusion 921, with respect to the connection part 930.

Through such a structure, a part which is to be repaired (welded or cut) is reduced in size, and thus is more easily, accurately, and quickly repaired.

Figure 10:
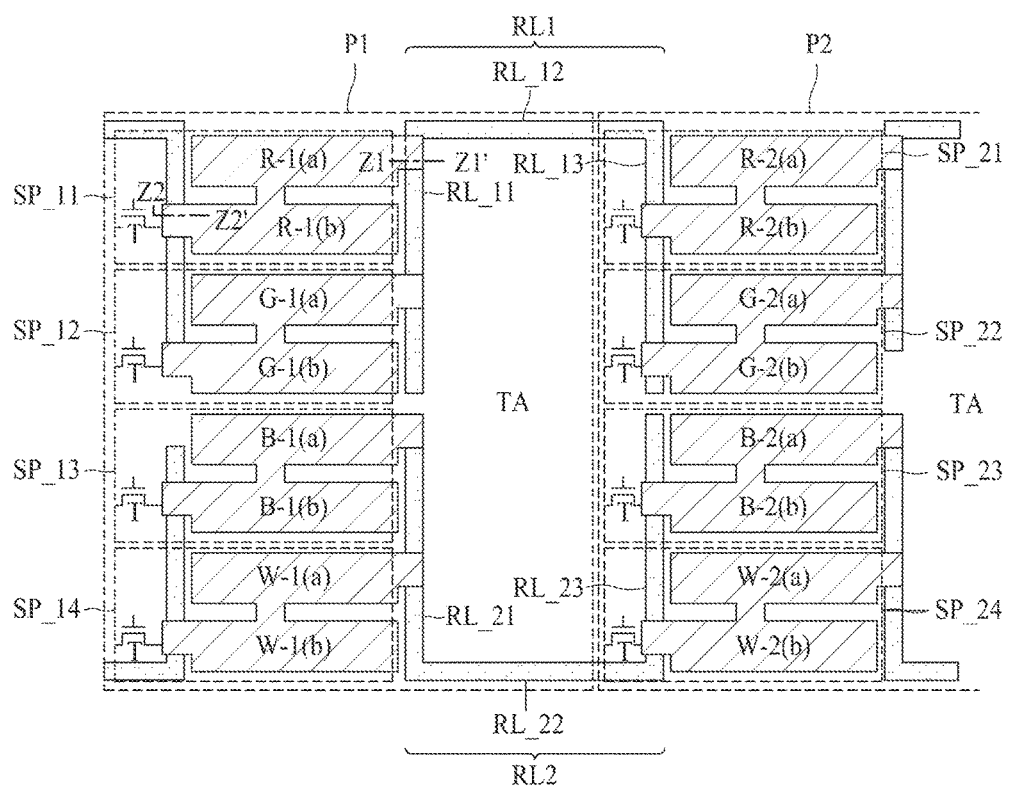
FIG. 10 is a diagram illustrating two transparent pixels having the subpixel structure of FIG. 9, in a transparent display device according to an embodiment.

FIG. 10 is a diagram illustrating two transparent pixels P1 and P2 which have the subpixel structure of FIG. 9 and are adjacent to each other in a second direction.

Referring to FIG. 10, a first repair line RL1 and a second repair line RL2 may simultaneously overlap a first transparent pixel P1 and a second transparent pixel P2 which are adjacent to each other in the second direction.

In detail, a second protrusion of each of a first subpixel SP_11 and a second subpixel SP_12 of the first transparent pixel P1 may overlap a first repair line part RL_11 of the first repair line RL1 in a first direction. A second repair line part RL_12 of the first repair line RL1 may be disposed in the second direction outside a transparent area TA of the first transparent pixel P1. A first protrusion of each of a first subpixel SP_21 and a second subpixel SP_22 of the second transparent pixel P2 may overlap a third repair line part RL_13 of the first repair line RL1 in the first direction. The other two subpixels SP_13 and SP_14 of the first transparent pixel P1 and the other two subpixels SP_23 and SP_24 of the second transparent pixel P2 may overlap the second repair line RL2.

That is, a second protrusion of each of a third subpixel SP_13 and a fourth subpixel SP_14 of the first transparent pixel P1 may overlap a first repair line part RL_21 of the second repair line RL2 in the first direction. A second repair line part RL_22 of the second repair line RL2 may be disposed in the second direction outside the transparent area TA of the first transparent pixel P1. A first protrusion of each of a third subpixel SP_23 and a fourth subpixel SP_24 of the second transparent pixel P2 may overlap a third repair line part RL_23 of the second repair line RL2 in the first direction.

Here, the first repair line RL1 and the second repair line RL2 may simultaneously overlap the first transparent pixel P1 and the second transparent pixel P2 which are adjacent to each other in the second direction. Also, the first repair line RL1 may be disconnected from the second repair line RL2.

Here, FIG. 10 discloses only a transparent pixel P including four subpixels SP, but as described above with reference to FIGS. 2 to 8, the number of subpixels SP may be variously changed without being limited to the embodiment illustrated in FIG. 10.

For example, in FIG. 10, if the first transparent pixel P1 and the second transparent pixel P2 each include three subpixels, the second protrusion of each of the first subpixel SP_11 and the second subpixel SP_12 of the first transparent pixel P1 may overlap the first repair line part RL_11 of the first repair line RL1 in the first direction. The second repair line part RL_12 of the first repair line RL1 may be disposed in the second direction outside the transparent area TA of the first transparent pixel P1. The first protrusion of each of the first subpixel SP_21 and the second subpixel SP_22 of the second transparent pixel P2 may overlap the third repair line part RL_13 of the first repair line RL1.

Moreover, the second protrusion of the third subpixel SP_13 of the first transparent pixel P1 may overlap the first repair line part RL_21 of the second repair line RL2. The second repair line part RL_22 of the second repair line RL2 may be disposed in the second direction outside the transparent area TA of the first transparent pixel P1. The first protrusion of the third subpixel SP_23 of the second transparent pixel P2 may overlap the third repair line part RL_23 of the second repair line RL2 in the first direction.

Therefore, in each of the first and second transparent pixels P1 and P2, if the number of subpixels is N number, the subpixels may be divided into N-M (where N and M are natural numbers, and M<N) number of first subpixel groups and M number of second subpixel groups. In this case, a repair line overlapping a second protrusion of a first subpixel group in the first transparent pixel P1 may be connected to a repair line overlapping a first protrusion of a first subpixel group in the second transparent pixel P2, and a repair line overlapping a second protrusion of a second subpixel group in the first transparent pixel P1 may be connected to a repair line overlapping a first protrusion of a second subpixel group in the second transparent pixel P2. Here, a repair line disposed in the first subpixel group may be disconnected from a repair line disposed in the second subpixel group.

Here, the repair line EL may be connected to another transparent pixel via the outside of the transparent area TA in order for an aperture ratio of the transparent area TA not to be reduced.

The transparent display device 100 according to the present embodiment may be an LCD device, an organic light emitting display device, or the like. Hereinafter, a case where the transparent display device 100 is an organic light emitting display device will be described as an example.

Figure 11A:
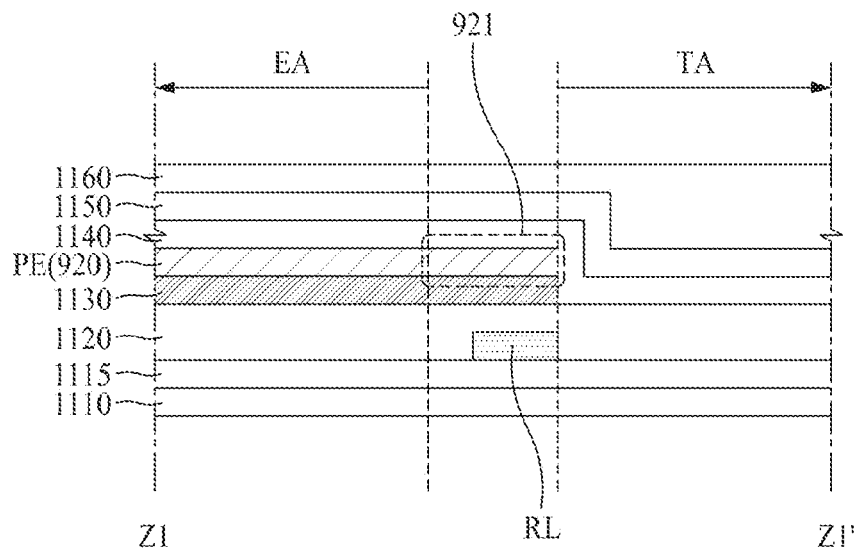
FIGS. 11A and 11B are partial cross-sectional views of a transparent pixel having a transparent pixel structure in a transparent display device according to an embodiment.
Figure 11B:
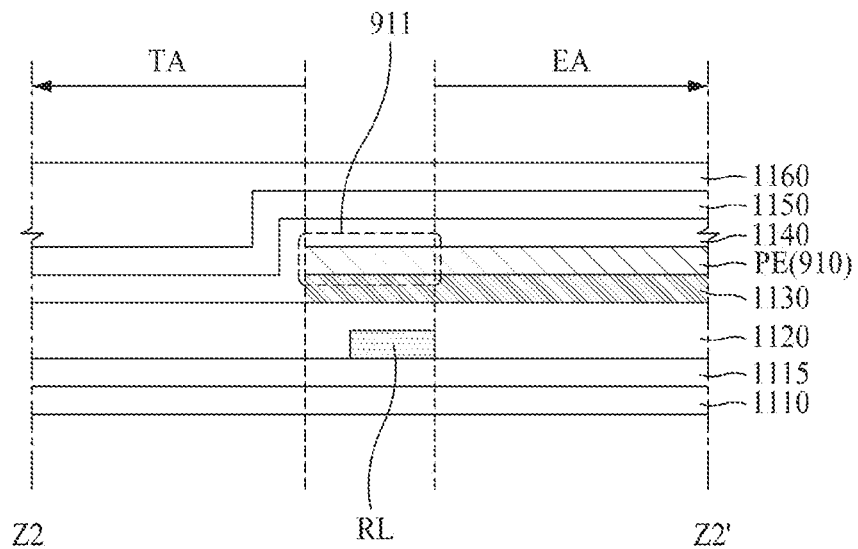

FIGS. 11A and 11B are partial cross-sectional views of a transparent pixel P having a transparent pixel structure in a transparent display device 100 according to an embodiment and are cross-sectional views taken along line Z1-Z1' and line Z2-Z2' of FIG. 10. FIGS. 11A and 11B are cross-sectional views before repair is performed.

Referring to FIGS. 11A and 11B, a first insulation layer 1115 disposed on a substrate 1110, a second insulation layer 1120 disposed on the first insulation layer 1115, a reflective layer 1130 disposed on the second insulation layer 1120, a pixel electrode PE disposed on the reflective layer 1130, an organic layer 1140 disposed on the pixel electrode PE, a common electrode 1150 including a transparent material disposed on the organic layer 1140, and an encapsulation layer 1160 disposed on the common electrode 1150 may be provided in an area where a plurality of subpixels SP included in each of a plurality of transparent pixels P are each provided.

The first insulation layer 1115 may be formed, and then, a repair line RL may be formed at a predetermined position. Subsequently, the second insulation layer 1120 may be formed.

The reflective layer 1130 and the pixel electrode PE may be patterned by using the same mask.

Here, the first insulation layer 1115, the second insulation layer 1120, the organic layer 1140, the common electrode 1150, and the encapsulation layer 1160 may each be formed of a transparent material. The cross-sectional views of a subpixel SP illustrated in FIGS. 11A and 11B relate to a top emission type for example.

The pixel electrode PE illustrated in the cross-sectional view of FIG. 11A corresponds to a second part 920 where a second protrusion 921 is provided, and the pixel electrode PE illustrated in the cross-sectional view of FIG. 11B corresponds to a first part 910 where a first protrusion 911 is provided.

Referring to FIG. 11A, a repair line RL may be formed under the second protrusion 921 with being insulated by the second insulation layer 1120. Referring to FIG. 11B, the repair line RL may be formed under the first protrusion 911 with being insulated by the second insulation layer 1120. Here, the repair line RL may be formed on a layer on which a gate electrode is formed, a layer on which a source-drain electrode is formed, or a layer on which a separate pattern is formed.

In FIG. 11B, a driving transistor DRT that is connected to the pixel electrode PE to apply a current to the pixel electrode PE is not illustrated. However, the driving transistor DRT may be formed under the pixel electrode PE for maximizing a transparent area TA. Here, the driving transistor DRT may not be connected to the repair line RL.

Referring to FIGS. 11A and 11B, the common electrode 1150 including the transparent material may be formed in the transparent area TA of each transparent pixel P without the reflective layer 1130 and the pixel electrode PE. Here, depending on the case, as illustrated in FIGS. 11A and 11B, the organic layer 1140 may be formed or not in the transparent area TA of each transparent pixel P.

Here, the pixel electrode PE may be an anode electrode (or a cathode electrode) of an organic light emitting diode (OLED), and the common electrode 1150 may be the cathode electrode (or the anode electrode) of the OLED.

The subpixels of each transparent pixel P may each include the organic layer 1140 that emits light of a corresponding color. In this case, the organic layer 1140 may include an emission layer that emits light of a corresponding color.

Moreover, all the subpixels of each transparent pixel P may each include the organic layer 1140 that emits white light. In this case, the organic layer 1140 may be formed on the common electrode 1150, and each of the subpixels may further include a color filter (not shown) that converts white light into light of a corresponding color.

By implementing a cross-sectional structure illustrated in FIGS. 11A and 11B, the transparent display device 100 is implemented.

The subpixels SP may include a circuit area CA, where the transistor T and the like are formed, and an emission area EA that emits light.

In FIGS. 11A and 11B, an area where the organic layer 1140 is formed may correspond to the emission area EA.

The transistor T illustrated in FIG. 10 may be one element formed in the circuit area CA and may correspond to the driving transistor DRT for driving an OLED.

The circuit area CA of each subpixel SP of the organic light emitting display device will be exemplarily described with reference to FIG. 12.

Figure 12:
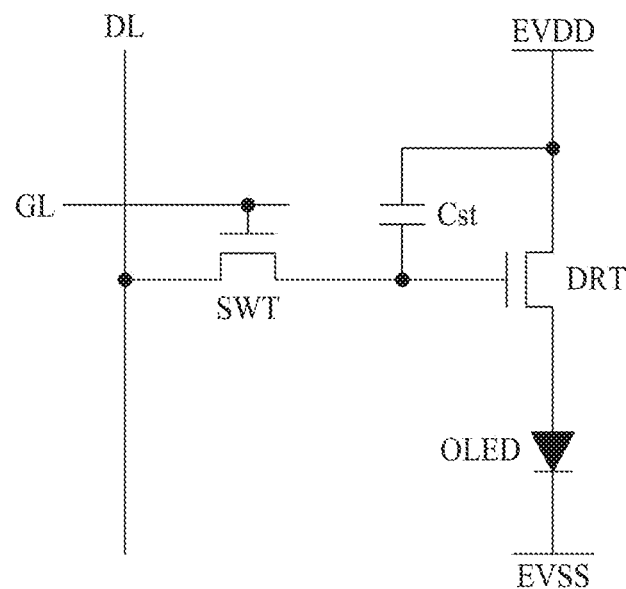
FIG. 12 is a fundamental equivalent circuit diagram of a subpixel in a transparent display device according to an embodiment.

FIG. 12 is a fundamental equivalent circuit diagram of a subpixel SP in a transparent display device 100 according to an embodiment.

Referring to FIG. 12, a plurality of subpixels SP may each include a driving transistor DRT for driving an organic light emitting diode OLED, a switching transistor SWT for controlling a gate voltage of the driving transistor DRT, and a storage capacitor Cst for holding a certain voltage during one frame period.

FIG. 12 illustrates a 2T-1C structure including two transistors (for example, DRT and SWT) and one capacitor (for example, Cst). Each of the plurality of subpixels may have a structure which further includes one or more transistors or further includes one or more capacitors, in addition to the 2T-1C structure.

Hereinafter, an operation of repairing a defective pixel in the above-described transparent pixel structure will be described. Here, the repair may be performed in a process of manufacturing the transparent display panel 110 before releasing a product, and after the product is released, the repair may be performed according to an after-service request of a consumer.

Figure 13:
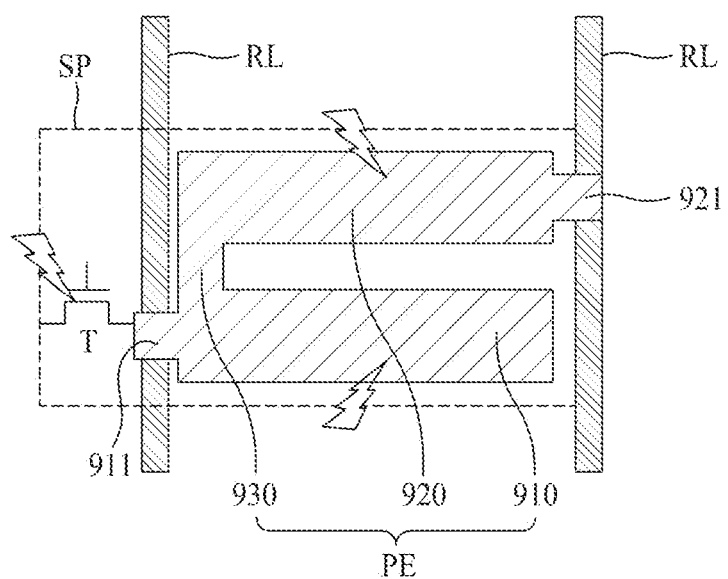
FIG. 13 is a diagram for describing a cause of a transparent pixel defect associated with a subpixel structure in a transparent display device according to an embodiment.

FIG. 13 is a diagram for describing a cause of a transparent pixel defect associated with a subpixel structure in a transparent display device 100 according to an embodiment.

Referring to FIG. 13, as described above, a transistor T and a pixel electrode PE may be provided in each of a plurality of subpixels SP.

Referring to FIG. 13, a foreign material which is a first cause of a transparent pixel defect penetrates into a portion, where the transistor T is formed, in a manufacturing process and causes short circuit between a gate of the transistor T and a source or a drain of the transistor T which is connected to a high-level voltage EVDD terminal. In this case, a corresponding subpixel SP is whitened to sparkle radiantly, and a transparent pixel P including the corresponding subpixel SP is whitened.

Referring to FIG. 13, short circuit which is a second cause of a transparent pixel defect occurs between the gate of the transistor T and the source or the drain of the transistor T which is connected to a low-level voltage EVSS terminal. In this case, a corresponding subpixel SP is blacked not to emit light, and a transparent pixel P including the corresponding subpixel SP is blackened.

Referring to FIG. 13, a foreign material which is a third cause of a transparent pixel defect penetrates into a portion, where a first part 910 of a pixel electrode PE is provided, in a manufacturing process and causes short circuit between the pixel electrode PE (for example, an anode electrode) and the common electrode 1150 (for example, a cathode electrode). In this case, a corresponding subpixel SP is blacked not to emit light, and a transparent pixel P including the corresponding subpixel SP is blackened.

Referring to FIG. 13, a foreign material which is a fourth cause of a transparent pixel defect penetrates into a portion, where a second part 920 of the pixel electrode PE is provided, in a manufacturing process and causes short circuit between the pixel electrode PE (for example, the anode electrode) and the common electrode 1150 (for example, the cathode electrode). In this case, a corresponding subpixel SP is blacked not to emit light, and a transparent pixel P including the corresponding subpixel SP is blackened.

Figure 14:
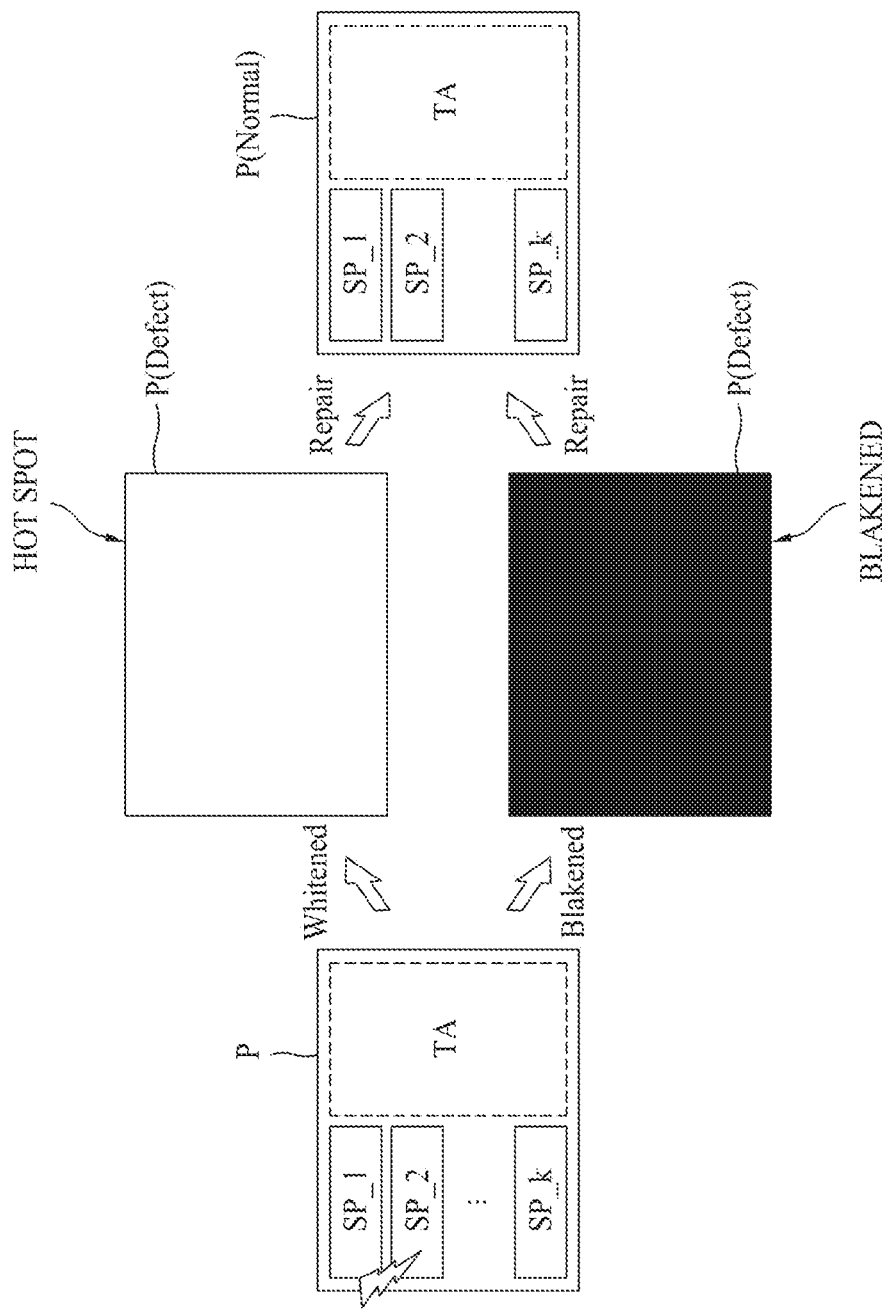
FIG. 14 is a diagram conceptually illustrating a repair operation for a transparent pixel defect in a transparent display device according to an embodiment.

FIG. 14 is a diagram conceptually illustrating a repair operation for a transparent pixel defect in a transparent display device 100 according to an embodiment.

Referring to FIG. 14, when one of the four causes of the transparent pixel defects described above with reference to FIG. 13 occurs in one subpixel SP_2 of a plurality of subpixels SP_1, . . . , and SP_k included in a transparent pixel P, the subpixel SP_2 is blackened or whitened, causing a defect where the transparent pixel P is whitened or blackened.

By repairing the defect of the transparent pixel P, the subpixel SP_2 and the transparent pixel P including the same may normally operate.

Therefore, after the transparent display panel 110 according to the present embodiment is released, all transparent pixels P and all subpixels SP may be in a state where repair is not performed, or at least one transparent pixel P, namely, at least one subpixel SP, may be in a state of being repaired.

The present embodiment discloses a repair structure and a repair method, in which repair is performed in order for a defective subpixel SP and a transparent pixel P including the same to normally operate, despite having a transparent pixel structure and a transparent pixel arrangement structure where the transparent area TA is disposed between subpixels which are adjacent to each other in the second direction. Also, the present embodiment discloses the transparent display panel 110 and the transparent display device 100 having the repair structure and discloses the transparent display panel 110 and the transparent display device 100, for which repair has been performed. This will be described below in more detail.

Figure 15:
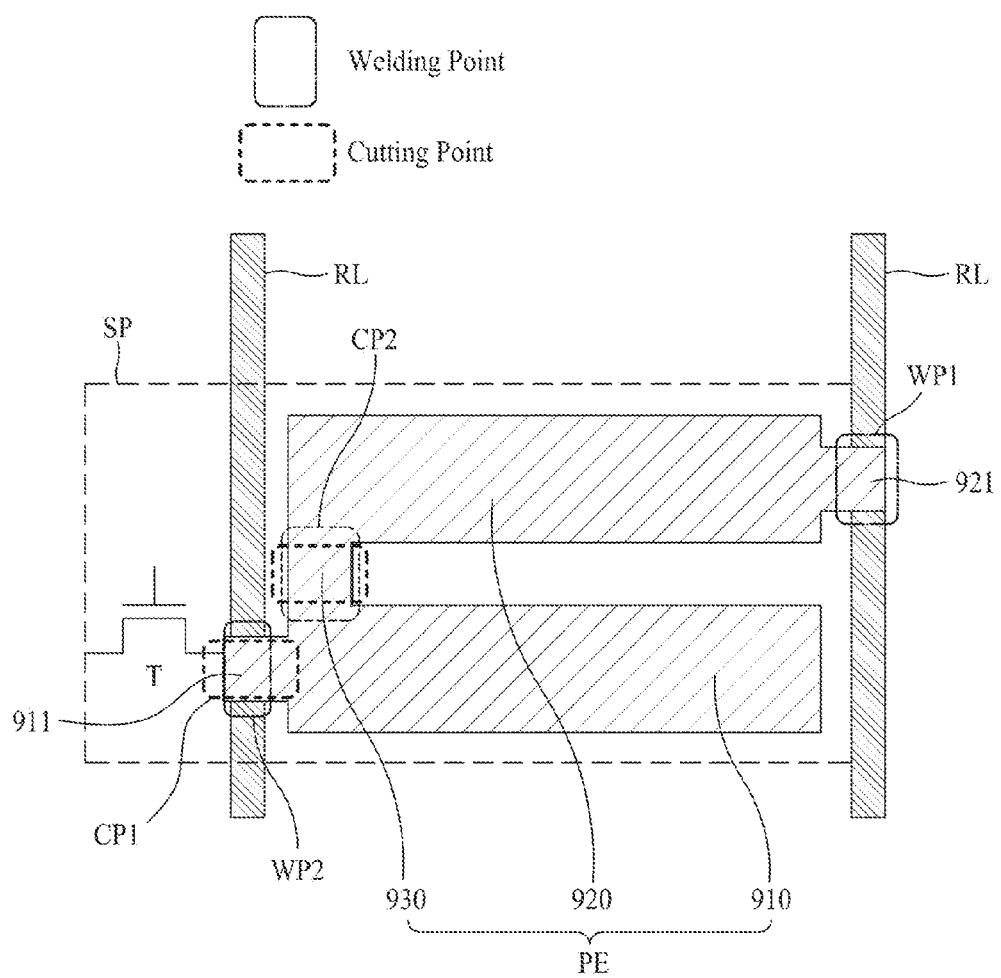
FIG. 15 is a diagram exemplarily illustrating a point at which repair is to be performed on a defective transparent pixel, in a transparent display device according to an embodiment.
Figure 16:
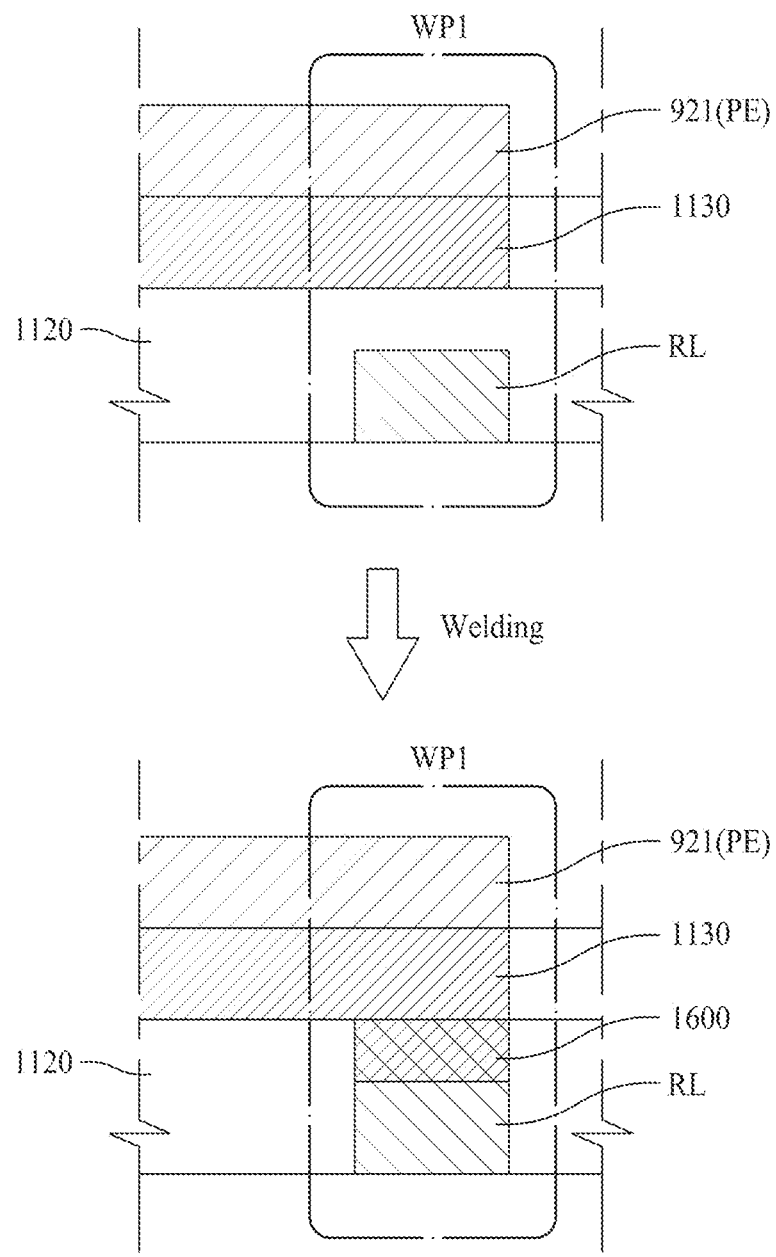
FIG. 16 is a diagram illustrating a welding operation performed at a welding point in repairing a defective transparent pixel, in a transparent display device according to an embodiment.

FIG. 15 is a diagram exemplarily illustrating a point at which repair is to be performed on a defective transparent pixel, in a transparent display device 100 according to an embodiment. FIG. 16 is a diagram illustrating a welding operation performed at a welding point in repairing a defective transparent pixel, in a transparent display device 100 according to an embodiment. FIG. 17 is a diagram illustrating a cutting operation performed at a cutting point in repairing a defective transparent pixel, in a transparent display device 100 according to an embodiment. FIG. 18 is a diagram illustrating a cutting and welding operation performed at a cutting and welding point in repairing a defective transparent pixel, in a transparent display device 100 according to an embodiment.

Referring to FIG. 15, a pixel electrode PE may be provided in each of a plurality of subpixels SP included in each of a plurality of transparent pixels P. The pixel electrode PE may include a first part 910 and a second part 920 which are portioned with respect to a connection part 930. Here, the first part 910 may be a part connectable to a transistor T, and the second part 920 may be a part opposite to the first part 910 with respect to the connection part 930.

Referring to FIG. 15, a first protrusion 911 may be provided in the first part 910 of the pixel electrode PE. The first protrusion 911 may be is connected to or cut from the transistor T, or may be cut from the transistor T and may be welded with a repair line RL.

Moreover, referring to FIG. 15, a second protrusion 921 may be provided in the second part 920 of the pixel electrode PE. Here, the second protrusion 921 may be spaced apart from the repair line RL and may be welded with the repair line RL for performing repair.

Referring to FIGS. 15 and 16, the first protrusion 911 provided in the first part 910 of the pixel electrode PE may be a first cutting point CP1 which is to be cut for repair, and may be a second welding point WP2 which is to be welded.

Moreover, the second protrusion 921 provided in the second part 920 may be a first welding point WP1 which is to be welded for repair.

Referring to FIGS. 15 and 16, before repair is performed, the second protrusion 921 provided in the second part 920 of the pixel electrode PE may have the same electric potential as that of a reflective layer 1130 and may be insulated from and spaced apart from the repair line RL by a second insulation layer 1120.

Referring to FIGS. 15 and 16, after repair is performed through welding, the reflective layer 1130 having the same electric potential as that of the pixel electrode PE may be connected to the repair line RL, and the second protrusion 921 provided in the second part 920 of the pixel electrode PE may be connected to the repair line RL. At this time, a connection pattern 1600 which connects the repair line RI, and the reflective layer 1130 under the second protrusion 921 may be formed through welding between the repair line RL and the reflective layer 1130 under the second protrusion 921. Here, the connection pattern 1600 may be modified depending on a welding method, and for example, a portion of the reflective layer 1130 and/or a portion of the repair line RL may be melted, and the connection pattern 1600 may be a pattern including a material different from materials of the reflective layer 1130 and the repair line RL.

Figure 17A:
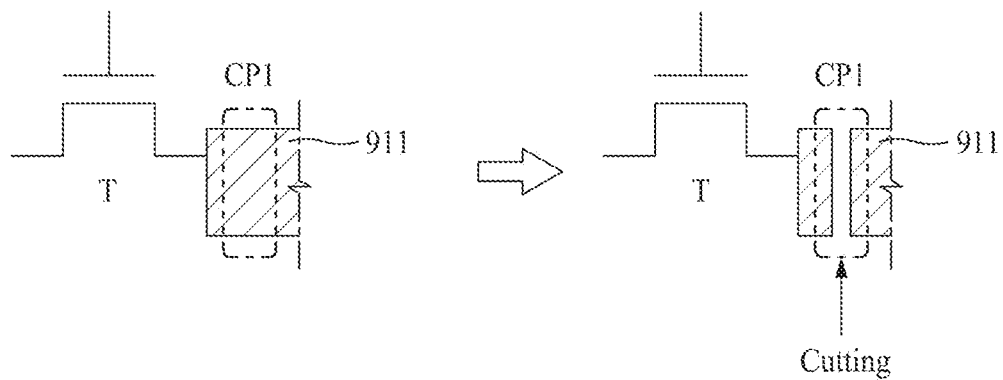
FIGS. 17A and 17B are diagrams illustrating a cutting operation performed at a cutting point in repairing a defective transparent pixel, in a transparent display device according to an embodiment.

Referring to FIGS. 15 and 17A, the first protrusion 911 provided in the first part 910 of the pixel electrode PE may be a first cutting point CP1 which is to be cut for repair (welding).

Referring to FIGS. 15 and 17A, before repair is performed, the first protrusion 911 provided in the first part 910 of the pixel electrode PE may be connected to the transistor T.

Referring to FIGS. 15 and 17A, after the repair is performed, the first protrusion 911 provided in the first part 910 of the pixel electrode PE may be cut. Therefore, the transistor T may be disconnected from the pixel electrode PE.

Figure 17B:
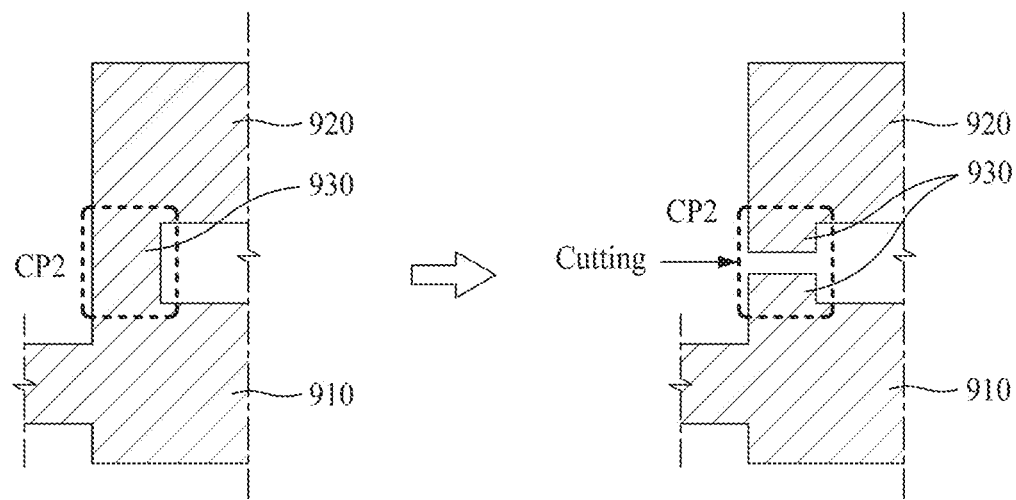

Referring to FIGS. 15 and 17B, the connection part 930 of the pixel electrode PE may be a second cutting point CP2 which is to be cut.

Referring to FIGS. 15 and 17B, before the repair is performed, the connection part 930 of the pixel electrode PE may be in an uncut state, and after the repair is performed, the connection part 930 of the pixel electrode PE may be in a cut state.

Referring to FIGS. 15 and 18, before the repair is performed, the first protrusion 911 provided in the first part 910 of the pixel electrode PE may be connected to the transistor T. Also, the first protrusion 911 may have the same electric potential as that of the reflective layer 1130 and may be insulated from and spaced apart from the repair line RL by the second insulation layer 1120.

Referring to FIGS. 15 and 18, the first protrusion 911 provided in the first part 910 of the pixel electrode PE may be the first cutting point CP1 which is to be cut for repair (welding), and may be the second welding point WP2 which is to be welded for repair (welding).

Referring to FIGS. 15 and 18, after the repair is performed, the first protrusion 911 provided in the first part 910 of the pixel electrode PE may be cut. Therefore, the transistor T may be disconnected from the pixel electrode PE.

Subsequently, the first protrusion 911 cut from the transistor T may be repaired through welding. That is, the reflective layer 1130 having the same electric potential as that of the pixel electrode PE may be connected to the repair line RL, and the first protrusion 911 provided in the first part 910 of the pixel electrode PE may be connected to the repair line RL. At this time, the connection pattern 1600 which connects the repair line RL and the reflective layer 1130 under the first protrusion 911 may be formed through welding between the repair line RL and the reflective layer 1130 under the first protrusion 911. Here, the connection pattern 1600 may be modified depending on a welding method, and for example, a portion of the reflective layer 1130 and/or a portion of the repair line RL may be melted, and the connection pattern 1600 may be a pattern including a material different from materials of the reflective layer 1130 and the repair line RL.

Figure 19:
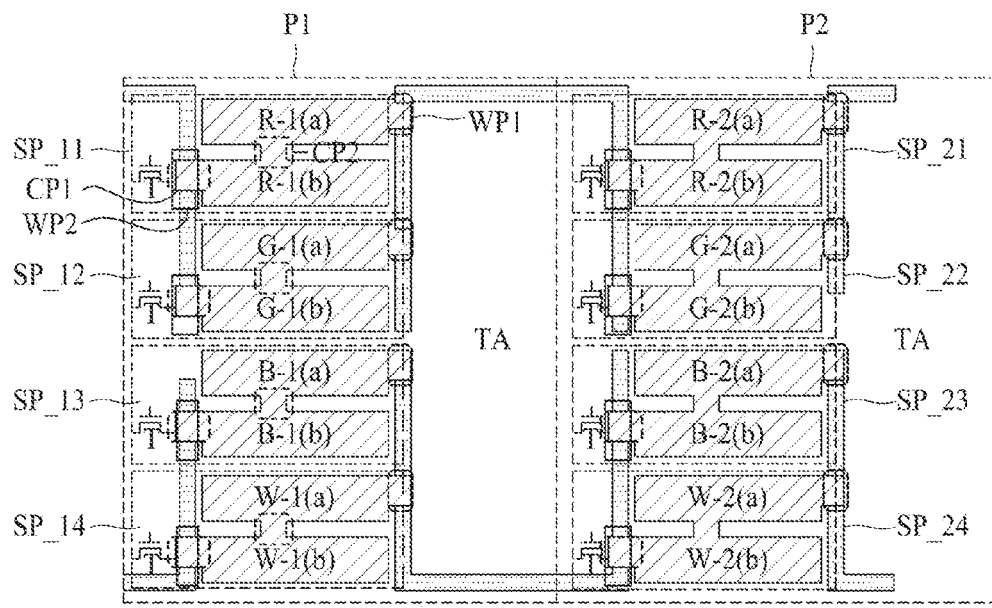
FIG. 19 is a diagram exemplarily illustrating a point which is to be repaired in one transparent pixel having a transparent pixel structure, in a transparent display device according to an embodiment.

FIG. 19 is a diagram illustrating that two welding points WP1 and WP2 and two cutting points CP1 and CP2 shown in one subpixel SP described above with reference to FIGS. 15 to 18 are shown in a plurality of subpixels SP_11, SP_12, SP_13 and SP_14 included in a first transparent pixel P1 and a plurality of subpixels SP_21, SP_22, SP_23 and SP_24 included in a second transparent pixel P2.

Moreover, two repair lines (e.g., a first repair line and a second repair line) for repair may be provided between the subpixels SP_11, SP_12, SP_13 and SP_14 included in the first transparent pixel P1 and the subpixels SP_21, SP_22, SP_23 and SP_24 included in the second transparent pixel P2.

Here, the first repair line and the second repair line have been described above with reference to FIG. 10, and thus, their detailed descriptions are omitted.

FIGS. 20 to 23 are exemplary diagrams illustrating a state, where repair has been performed at each of points at which defects occur, in a four-subpixel-based transparent pixel structure in a transparent display device 100 according to an embodiment.

Figure 20:
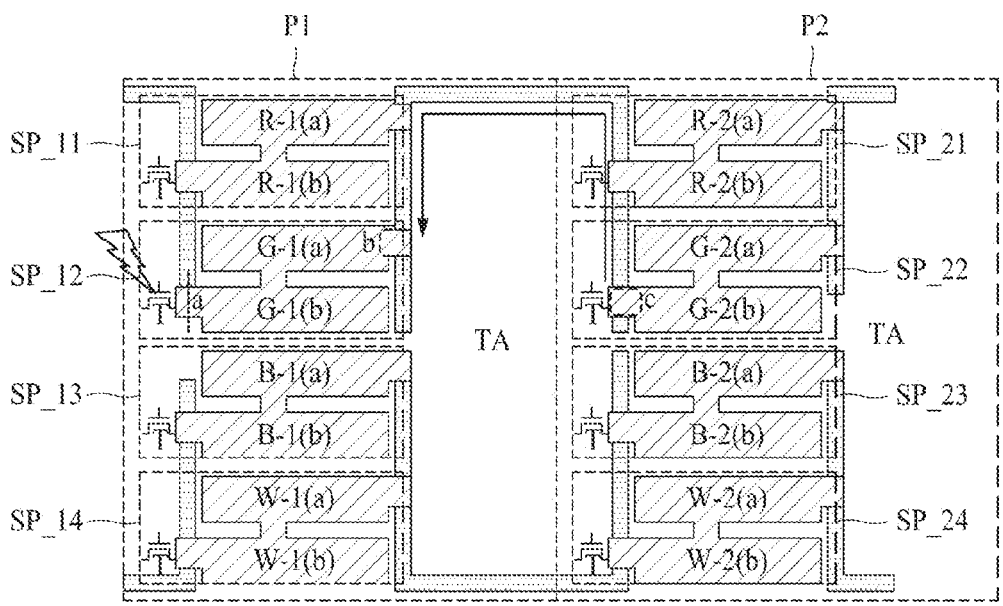
FIGS. 20 to 23 are exemplary diagrams illustrating a state, where repair has been performed at each of points at which defects occur, in a four-subpixel-based transparent pixel structure in a transparent display device according to an embodiment.
Figure 21:
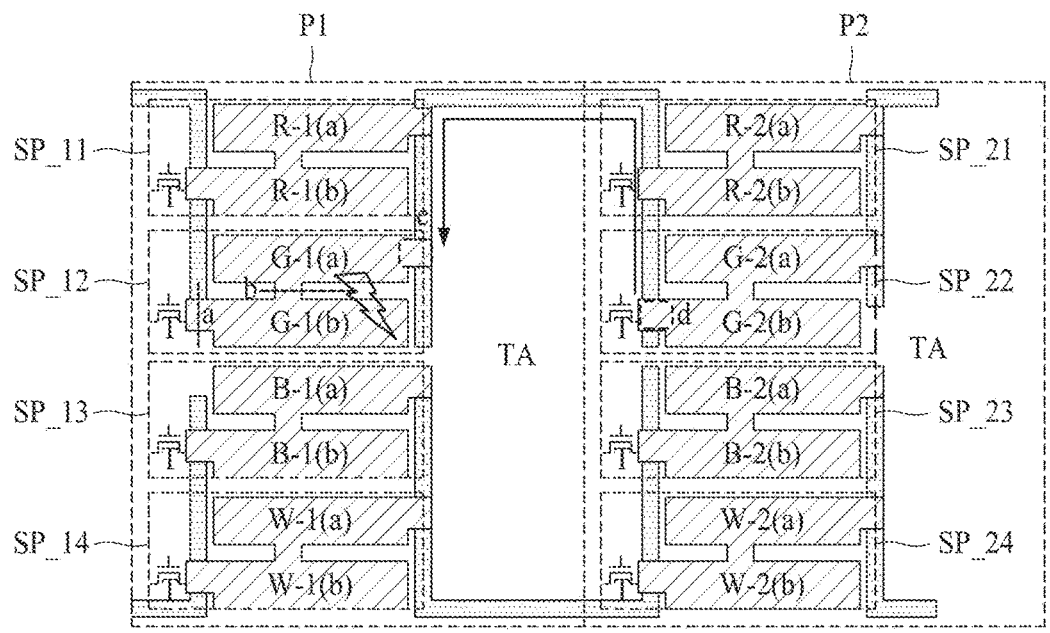
Figure 22:
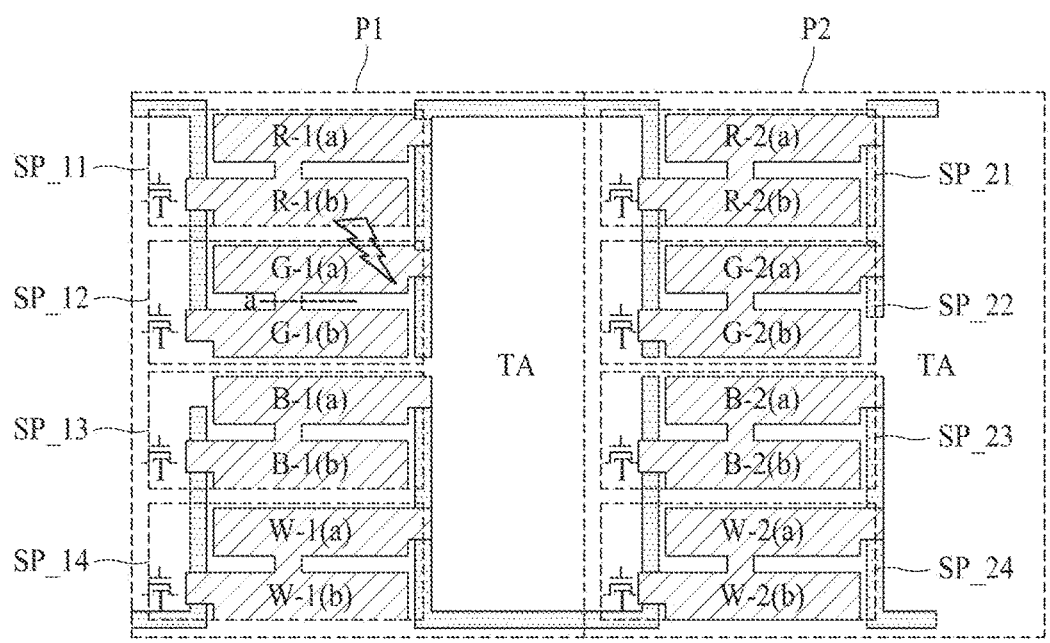

In FIGS. 20 to 22, for convenience of description, a first transparent pixel P1 and a second transparent pixel P2 which are adjacent to each other in a second direction in a transparent display panel including a plurality of transparent pixels will be described as an example. Also, it is assumed that the first transparent pixel P1 includes the subpixel SP_11 emitting red light, the subpixel SP_12 emitting green light, the subpixel SP_13 emitting blue light, and the subpixel SP_14 emitting white light, and the second transparent pixel P2 includes the subpixel SP_21 emitting red light, the subpixel SP_22 emitting green light, the subpixel SP_23 emitting blue light, and the subpixel SP_24 emitting white light.

FIG. 20 is a diagram for describing a repair method and a repaired state when a defect (a hot spot or a dark spot caused by short circuit) occurs in a transistor T provided in the subpixel SP_12 among the subpixels SP_11, SP_12, SP_13 and SP_14 of the first transparent pixel P1.

Referring to FIG. 20, when a gate of the transistor T is short-circuited with a source or a drain connected to a high-level voltage EVDD terminal due to a foreign material which penetrated into the transistor T included in a second subpixel SP_12 among the subpixels SP_11, SP_12, SP_13 and SP_14 of the first transparent pixel P1, a high amount of current flows to a pixel electrode PE included in the second subpixel SP_12, and for this reason, the second subpixel SP_12 and the first transparent pixel P1 including the second subpixel SP_12 are whitened. Also, when the gate of the transistor T is short-circuited with the source or the drain connected to a low-level voltage EVSS terminal, the supply of a current to the pixel electrode PE included in the second subpixel SP_12 is blocked, and for this reason, the second subpixel SP_12 and the first transparent pixel P1 including the second subpixel SP_12 are blackened.

When such a pixel defect occurs, by performing a cutting process, a first part 910 connected to the transistor T may be cut (a point) in the pixel electrode PE included in the second subpixel SP_12 among the subpixels SP_11, SP_12, SP_13 and SP_14 of the first transparent pixel P1.

Also, in the pixel electrode PE included in the second subpixel SP_12 of the first transparent pixel P1, a second part 920 opposite to the first part 910 with respect to a connection part 930 may be connected to (b point) a repair line RL by performing a welding process.

Moreover, a transparent pixel including a subpixel having the same color as that of the second subpixel SP_12 where a defect occurs in the first transparent pixel P1 may be searched for.

The found transparent pixel may be a second transparent pixel P2 which is adjacent to the first transparent pixel P1 in the second direction, or may be a transparent pixel (not shown) which is adjacent thereto in a direction opposite to the second transparent pixel P2 with respect to the first transparent pixel P1. However, since the first part 910 connected to the transistor T has been cut in the pixel electrode PE included in the second subpixel SP_12, the second transparent pixel P2 may be performed for convenience of repair.

In the embodiment of FIG. 20, the second subpixel SP_12 where a defect occurs in the first transparent pixel P1 may be a green subpixel, and thus, the found transparent pixel is illustrated with respect to the second transparent pixel P2 which is adjacent thereto to the right of the first transparent pixel P1.

Therefore, by performing a welding process, the first part 910 connected to the transistor T with respect to the connection part 930 may be connected to (c point) the repair line RL in the pixel electrode PE included in the subpixel SP_22, having the same color (green) as that of the second subpixel SP_12 where the defect occurs in the first transparent pixel P1, among subpixels SP_21, SP_22, SP_23 and SP_24 of a second transparent pixel P2.

Through such a repair, the pixel electrode PE included in the second subpixel SP_12 of the first transparent pixel P1 may be supplied with a driving current from the transistor T included in a subpixel (SP_22 in the embodiment of FIG. 20) included in another transparent pixel (P2 in the embodiment of FIG. 20) which is not adjacent to the second subpixel SP_12 where the defect occurs in the first transparent pixel P1.

Therefore, even when a hot spot or a dark spot occurs due to a defect which occurs in the transistor T included in one subpixel SP_12 of the first transparent pixel P1, by repairing the defect, the subpixel SP_12 of the first transparent pixel P1 where the defect occurs and the first transparent pixel P1 may normally operate.

FIG. 21 is a diagram for describing a repair method and a repaired state when a defect occurs in a first part 910 connected to a transistor T in a pixel electrode PE provided in a subpixel SP_12 among subpixels SP_11, SP_12, SP_13 and SP_14 of a first transparent pixel P1.

Referring to FIG. 21, when the first part 910 connected to the transistor T is short-circuited with the common electrode 1150 (for example, a cathode electrode) in the pixel electrode PE provided in the subpixel SP_12 among the subpixels SP_11, SP_12, SP_13 and SP_14 of the first transparent pixel P1, there is no potential difference between the pixel electrode PE included in a second subpixel SP_12 and the common electrode 1150, and for this reason, light is not emitted from the organic layer 1140 therebetween, causing a dark spot.

An operation of repairing the defective pixel will be described below with reference to FIG. 21.

By performing a cutting process, a first part 910 connected to the transistor T may be cut (a point) in the pixel electrode PE included in the second subpixel SP_12 among the subpixels SP_11, SP_12, SP_13 and SP_14 of the first transparent pixel P1.

Also, by performing a cutting process, a connection part 930 may be cut (b point) in the pixel electrode PE included in the second subpixel SP_12 of the first transparent pixel P1.

Moreover, in the pixel electrode PE included in the second subpixel SP_12 of the first transparent pixel P1, a second part 920 opposite to the first part 910 with respect to the connection part 930 may be connected to (c point) a repair line RL by performing a welding process.

Moreover, a transparent pixel including a subpixel having the same color (G) as that of the second subpixel SP_12 where a defect occurs in the first transparent pixel P1 may be searched for.

The found transparent pixel may be a second transparent pixel P2 which is adjacent to the first transparent pixel P1 in the second direction, or may be a transparent pixel (not shown) which is adjacent thereto in a direction opposite to the second transparent pixel P2 with respect to the first transparent pixel P1. However, since the connection part 930 has been cut in the pixel electrode PE included in the second subpixel SP_12, the second transparent pixel P2 may be performed for convenience of repair.

In the embodiment of FIG. 21, the second subpixel SP_12 where a defect occurs in the first transparent pixel P1 may be a green subpixel, and thus, the found transparent pixel is illustrated with respect to the second transparent pixel P2 which is adjacent thereto to the right of the first transparent pixel P1.

Therefore, by performing a welding process, the first part 910 connected to the transistor T with respect to the connection part 930 may be connected to (d point) the repair line RL in the pixel electrode PE included in the subpixel SP_22, having the same color as that of the second subpixel SP_12 where the defect occurs in the first transparent pixel P1, among the subpixels SP_21, SP_22, SP_23 and SP_24 of the second transparent pixel P2.

Through such a repair, the second part 920 of the pixel electrode PE included in the second subpixel SP_12 of the first transparent pixel P1 may be supplied with a driving current from the transistor T included in a subpixel (SP_22 in the embodiment of FIG. 21) included in another transparent pixel (P2 in the embodiment of FIG. 21) which is not adjacent to the second subpixel SP_12 where the defect occurs in the first transparent pixel P1.

Therefore, even when a dark spot occurs due to a defect which occurs in one part 910 of the pixel electrode PE included in one subpixel SP_12 of the first transparent pixel P1, by repairing the defect, the subpixel SP_12 of the first transparent pixel P1 where the defect occurs and the first transparent pixel P1 may normally operate.

FIG. 22 is a diagram for describing a repair method and a repaired state when a defect occurs in a second part 920 opposite to a first part 910 connected to a transistor T in a pixel electrode PE provided in a subpixel SP_12 among subpixels SP_11, SP_12, SP_13 and SP_14 of a first transparent pixel P1.

Referring to FIG. 22, when the second part 920 opposite to the first part 910 connected to the transistor T is short-circuited with the common electrode 1150 (for example, a cathode electrode) in the pixel electrode PE provided in one subpixel SP_12 among the subpixels SP_11, SP_12, SP_13 and SP_14 of the first transparent pixel P1, there is no potential difference between the pixel electrode PE included in a second subpixel SP_12 and the common electrode 1150, and for this reason, light is not emitted from the organic layer 1140 therebetween, causing a dark spot.

An operation of repairing the defective pixel will be described below with reference to FIG. 22.

By performing a cutting process, a connection part 930 may be cut (a point) in the pixel electrode PE included in the subpixel SP_12 emitting green light among the subpixels SP_11, SP_12, SP_13 and SP_14 of the first transparent pixel P1.

To describe the transparent display panel 110 for which the repair has been performed, the connection part 930 may be cut in the pixel electrode PE included in one subpixel SP_12 among the subpixels SP_11, SP_12, SP_13 and SP_14 of the first transparent pixel P1.

By performing the repair, the transistor T included in the subpixel SP_12 emitting green light in the first transparent pixel P1 may supply a driving current to only the first part 910 of the pixel electrode PE without transferring the driving current to the second part 920 of the pixel electrode PE short-circuited with the common electrode 1150 (for example, the cathode electrode).

Therefore, even when a dark spot occurs due to a defect which occurs in one part 910 of the pixel electrode PE included in one subpixel SP_12 of the first transparent pixel P1, by repairing the defect, the subpixel SP_12 of the first transparent pixel P1 where the defect occurs and the first transparent pixel P1 may normally operate.

Figure 23:
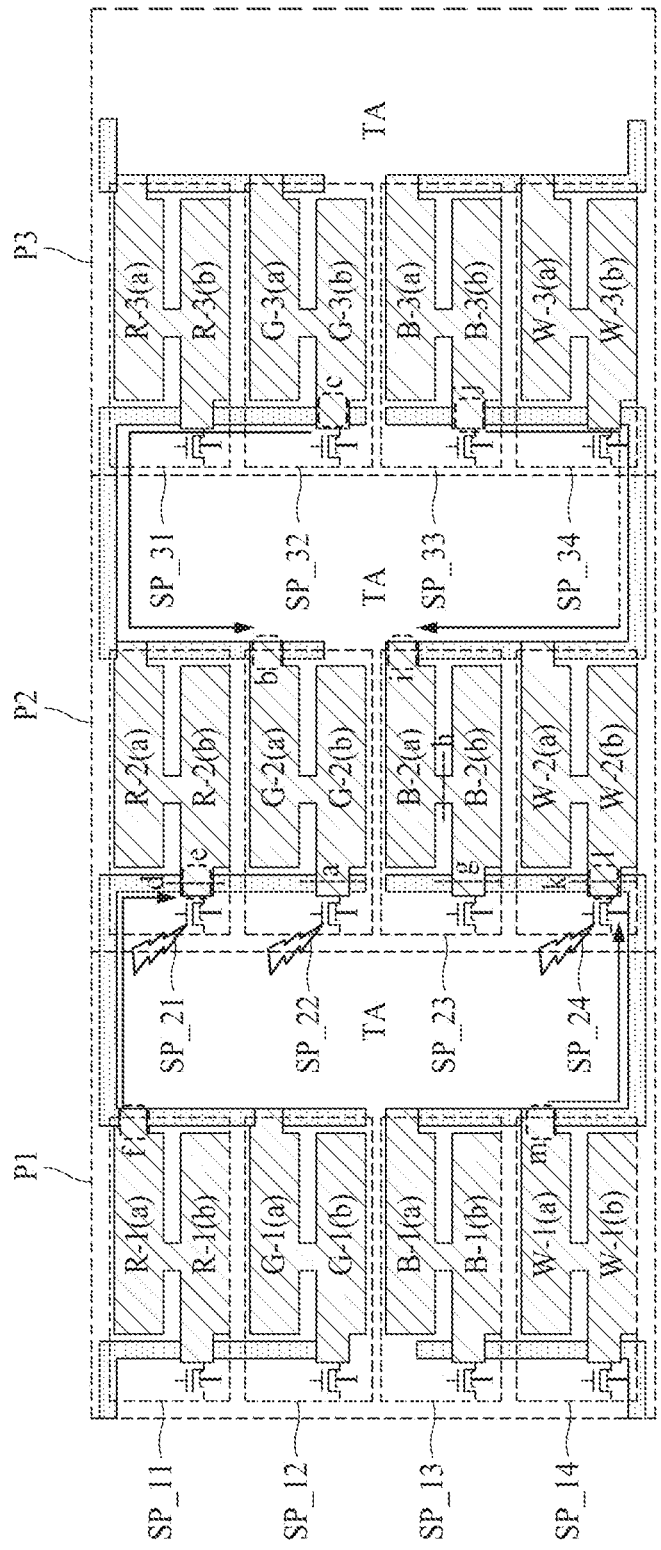

FIG. 23 is a diagram for describing a repair method and a repaired state when a dark spot or a hot spot occurs in all subpixels SP_21, SP_22, SP_23 and SP_24 of a second transparent pixel P2.

Here, a cause of a dark spot defect or a hot spot defect which occurs in a transistor T and a cause of a dark spot defect which occurs in a pixel electrode PE are the same as the above-described details, and thus, their detailed descriptions are not repeated.

Referring to FIG. 23, a first subpixel SP_21 and a second subpixel SP_22 among subpixels SP_21, SP_22, SP_23 and SP_24 of a second transparent pixel P2 each correspond to a case where a subpixel is whitened or blackened due to a defect which occurs in a transistor T included in the subpixel. Also, a third subpixel SP_23 corresponds to a case where a subpixel is blackened due to a defect which occurs in a first part 910 of a pixel electrode PE included in the subpixel, and a fourth subpixel SP_24 corresponds to a case which a subpixel is whitened or blackened due to a defect which occurs in the transistor T included in the subpixel.

An operation of performing repair in a case where a defect occurs in all subpixels included in one transparent pixel will be described with reference to FIG. 23.

First, an operation of repairing the second subpixel SP_22 of the second transparent pixel P2 will be described.

By performing a cutting process, the first part 910 connected to the transistor T may be cut (a point) in the pixel electrode PE included in the second subpixel SP_22 among the subpixels SP_21, SP_22, SP_23 and SP_24 of the second transparent pixel P2.

Also, in the pixel electrode PE included in the second subpixel SP_22 of the second transparent pixel P2, a second part 920 opposite to the first part 910 with respect to a connection part 930 may be connected to (b point) a repair line RL by performing a welding process.

Moreover, a transparent pixel including a subpixel having the same color as that of the second subpixel SP_22 where a defect occurs in the second transparent pixel P2 may be searched for.

The found transparent pixel may be a first transparent pixel P1 or a third transparent pixel P3 which is adjacent to the second transparent pixel P2 in the second direction.

In the embodiment of FIG. 23, the second subpixel SP_22 where a defect occurs in the second transparent pixel P2 may be a green subpixel, and thus, the found transparent pixel is illustrated with respect to the third transparent pixel P3 which is adjacent thereto to the right of the second transparent pixel P2.

Therefore, by performing a welding process, the first part 910 connected to the transistor T with respect to the connection part 930 may be connected to (c point) the repair line RL in the pixel electrode PE included in the subpixel SP_32, having the same color (green) as that of the second subpixel SP_12 where the defect occurs in the first transparent pixel P1, among subpixels SP_31, SP_32, SP_33 and SP_34 of a third transparent pixel P3.

Through such a repair, the pixel electrode PE included in the second subpixel SP_22 of the second transparent pixel P2 may be supplied with a driving current from the transistor T included in a second subpixel SP_32 of the third transparent pixel P3 which is spaced apart from the second transparent pixel P2 by a transparent area TA.

Therefore, even when a hot spot or a dark spot occurs due to a defect which occurs in the transistor T included in one subpixel SP_22 of the second transparent pixel P2, by repairing the defect, the subpixel SP_22 of the second transparent pixel P2 where the defect occurs and the second transparent pixel P2 may normally operate.

Next, an operation of repairing the first subpixel SP_21 of the second transparent pixel P2 will be described.

Since the defect occurs in the transistor T, by performing a cutting process, a first protrusion 911 connected to the transistor T may be cut (d point) in the pixel electrode PE included in the first subpixel SP_21 of the second transparent pixel P2.

Subsequently, due to performing a welding process, it is unable to use a repair line RL which has been used to repair the second subpixel SP_22 of the second transparent pixel P2 for supplying a driving current to the first subpixel SP_21 of the second transparent pixel P2.

The second subpixel SP_22 and the first subpixel SP_21 of the second transparent pixel P2 may be supplied with different driving currents, and thus, one repair line RL may be used to repair only one subpixel SP.

Therefore, like the repair method described above with reference to FIG. 18, the first protrusion which has been cut from the transistor T in the first subpixel SP_21 of the second transparent pixel P2 may be welded with (e point) the repair line RL.

Subsequently, the first part 910 connected to the transistor T with respect to the connection part 930 may be connected to (f point) the repair line RL in the pixel electrode PE included in the first subpixel SP_11 of the first transparent pixel P1 which is disposed on the left with respect to the second subpixel SP_22 of the second transparent pixel P2 and has the same color (red) as that of the second subpixel SP_22.

Through such a repair, the pixel electrode PE included in the first subpixel SP_21 of the second transparent pixel P2 may be supplied with a driving current from the transistor T included in the first subpixel SP_11 of the first transparent pixel P1 which is spaced apart from the second transparent pixel P2 by the transparent area TA.

Therefore, even when a hot spot defect or a dark spot defect occurs in two subpixels SP_21 and SP_22 which is adjacent to each other in the first direction in the second transparent pixel P2, by repairing subpixels of the transparent pixels P1 and P3 through different repair lines RL, the first subpixel SP_21 of the second transparent pixel P2 where the defect occurs and the second subpixel SP_22 may normally operate.

Next, an operation of repairing the other subpixels (e.g., the third subpixel SP_23 and the fourth subpixel SP_24) which are adjacent to each other in the first direction in the second transparent pixel P2 will be described.

By performing a cutting process, a first part 910 connected to the transistor T may be cut (g point) in the pixel electrode PE included in the third subpixel SP_23 of the second transparent pixel P2.

Also, by performing a cutting process, a connection part 930 may be cut (h point) in the pixel electrode PE included in the third subpixel SP_23 of the second transparent pixel P2.

Moreover, in the pixel electrode PE included in the third subpixel SP_23 of the second transparent pixel P2, a second part 920 opposite to the first part 910 with respect to the connection part 930 may be connected to (i point) a repair line RL by performing a welding process.

Moreover, a transparent pixel including a subpixel having the same color (blue) as that of the third subpixel SP_23 where a defect occurs in the second transparent pixel P2 may be searched for.

The found transparent pixel may be a third transparent pixel P3 which is adjacent to the second transparent pixel P2 in the second direction and is spaced apart from the second transparent pixel P2 by the transparent area TA.

Therefore, by performing a welding process, the first part 910 connected to the transistor T with respect to the connection part 930 may be connected to (j point) the repair line RL in the pixel electrode PE included in the subpixel SP_33 having the same color as that of the third subpixel SP_23 where the defect occurs in the second transparent pixel P2.

Through such a repair, the second part 920 of the pixel electrode PE included in the third subpixel SP_23 of the second transparent pixel P2 may be supplied with a driving current from the transistor T included in the subpixel SP_33 included in the third transparent pixel P3 which is spaced apart from the third subpixel SP_23, where the defect occurs in the second transparent pixel P2, by the transparent area TA.

Therefore, even when a dark spot defect occurs due to a defect which occurs in one part 910 of the pixel electrode PE included in the third subpixel SP_23 of the second transparent pixel P2, by repairing the defect, the subpixel SP_23 of the second transparent pixel P2 where the defect occurs and the second transparent pixel P2 may normally operate.

Next, an operation of repairing the fourth subpixel SP_24 of the second transparent pixel P2 will be described.

Since the defect occurs in the transistor T, by performing a cutting process, a first protrusion 911 connected to the transistor T may be cut (k point) in the pixel electrode PE included in the fourth subpixel SP_24 of the second transparent pixel P2.

Subsequently, by performing a welding process, a subpixel which is disposed in the second direction for supplying a driving current to the pixel electrode PE included in the fourth subpixel SP_24 of the second transparent pixel P2 and has the same color (white) may be searched for.

The fourth subpixel SP_14 of the first transparent pixel P1 and the fourth subpixel SP_34 of the third transparent pixel P3 may each correspond to the found subpixel. However, the repair line RL shared by the fourth subpixel SP_24 of the second transparent pixel P2 and the fourth subpixel SP_34 of the third transparent pixel P3 have been welded for repairing the third subpixel SP_23 of the second transparent pixel P2, and for this reason, cannot be used.

The third subpixel SP_23 and the fourth subpixel SP_24 of the second transparent pixel P2 may be supplied with a driving current from subpixels of different transparent pixels, and thus, one repair line RL may be used to repair only one subpixel SP.

Therefore, the fourth subpixel SP_24 of the second transparent pixel P2 may be repaired along with the fourth subpixel SP_14 of the first transparent pixel P1.

Subsequently, like the repair method described above with reference to FIG. 18, the first protrusion which has been cut from the transistor T in the fourth subpixel SP_24 of the second transparent pixel P2 may be welded with (l point) the repair line RL.

Subsequently, the first part 910 connected to the transistor T with respect to the connection part 930 may be connected to (m point) the repair line RL in the pixel electrode PE included in the fourth subpixel SP_14 of the first transparent pixel P1 which is disposed on the left with respect to the fourth subpixel SP_24 of the second transparent pixel P2 and has the same color (red) as that of the fourth subpixel SP_24.

Through such a repair, the pixel electrode PE included in the fourth subpixel SP_24 of the second transparent pixel P2 may be supplied with a driving current from the transistor T included in the fourth subpixel SP_14 of the first transparent pixel P1 which is spaced apart from the second transparent pixel P2 by the transparent area TA.

Therefore, in two subpixels SP_23 and SP_24 which share the repair line RL and are adjacent to each other in the first direction in the second transparent pixel P2, a dark spot defect occurs in the first part 910 of the pixels electrode PE connected to the transistor T in one subpixel SP_23, and in the other subpixel SP_24, even when a hot spot defect or a dark spot defect occurs in the transistor T, by repairing the transparent pixels P1 and P3 which are adjacent to each other in different directions and share the repair line RL, the third subpixel SP_23 and the fourth subpixel SP_24 where the defect occurs in the second transparent pixel P2 may normally operate.

As described above, even when a hot spot or a dark spot occurs in all subpixels SP adjacent to each other in a first direction in one transparent pixel P due to a defect of a transistor T, or a dark spot occurs due to a defect of a transparent electrode PE, a driving current may be supplied from subpixels SP which are adjacent to each other in a second direction with a transparent area TA therebetween and have the same color.

Figure 24:
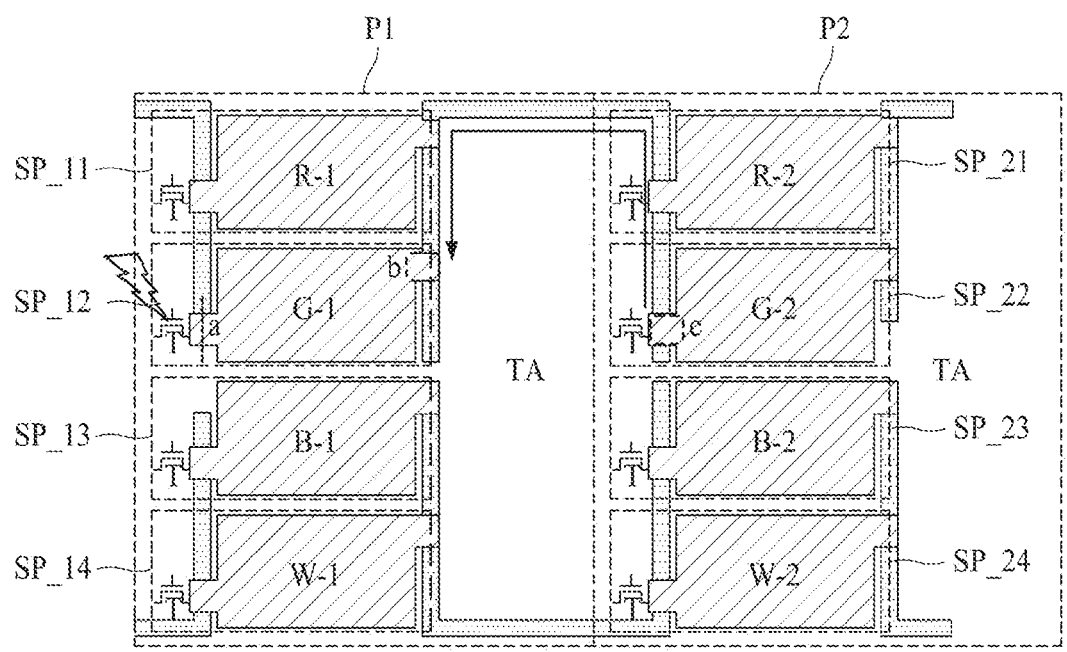
FIGS. 24 and 25 are exemplary diagrams illustrating a state, where repair has been performed at each of points at which defects occur, in a four-subpixel-based transparent pixel structure including four subpixels including a one-piece pixel electrode in a transparent display device according to an embodiment.

FIG. 24 illustrates an embodiment where a one-piece pixel electrode is applied as a pixel electrode PE in a subpixel SP structure for increasing luminance by enlarging an emission area in a transparent pixel P including four subpixels R, G, B and W.

In a repair method of repairing a pixel electrode PE structure illustrated in FIG. 24, the pixel electrode structure is not a structure where a pixel electrode PE is partitioned, and thus, when a dark spot defect occurs in a subpixel SP, it is unable to repair the subpixel SP.

When a dark or hot spot defect occurs in in the subpixel SP due to a defect of a transistor T connected to the pixel electrode PE, the subpixel SP may be repaired identically to a partitioned pixel electrode PE.

FIG. 24 is a diagram for describing a repair method and a repaired state when a defect (a hot spot or a dark spot caused by short circuit) occurs in a transistor T provided in a subpixel SP_12 among subpixels SP_11, SP_12, SP_13 and SP_14 of a first transparent pixel P1. The repair method may be the same as the repair method described above with reference to FIG. 20.

Figure 25:
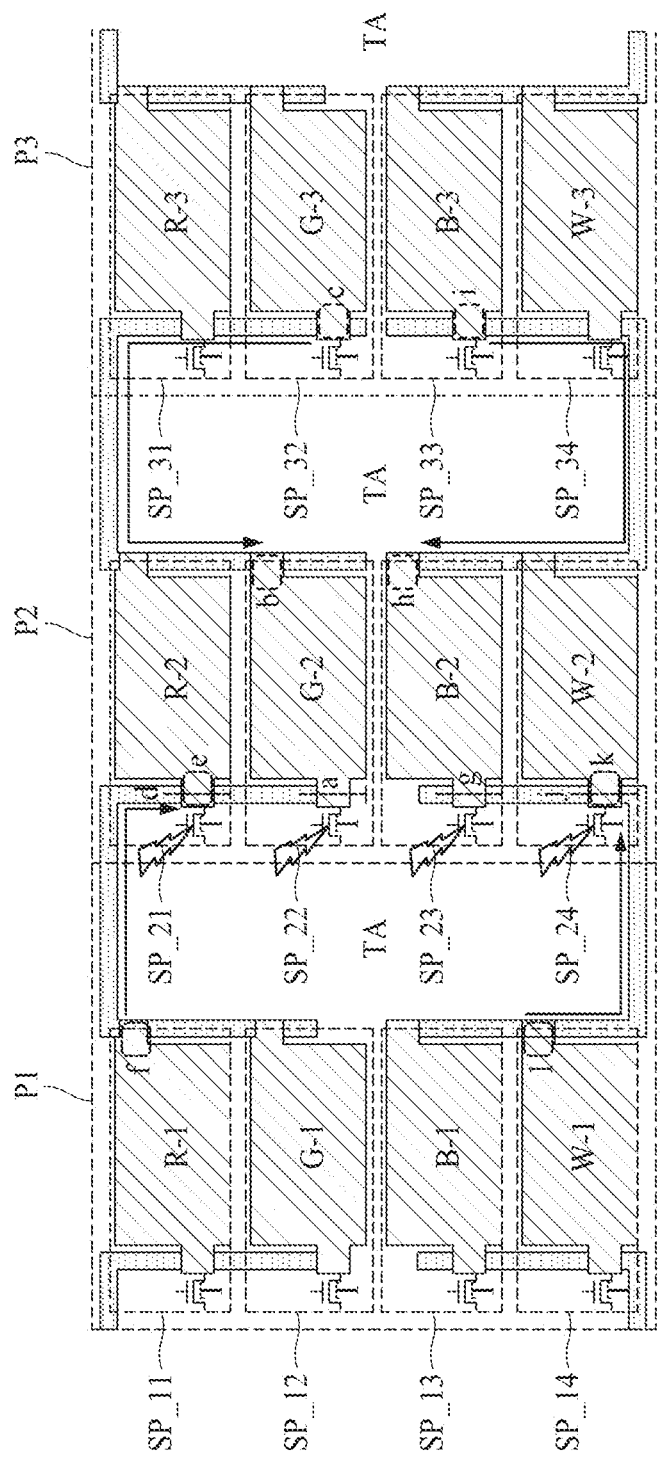

FIG. 25 illustrates an embodiment where a one-piece pixel electrode is applied as a pixel electrode PE in a subpixel SP structure for increasing luminance by enlarging an emission area in a transparent pixel P similarly to FIG. 24.

FIG. 25 is a diagram for describing a repair method and a repaired state when a hot spot or a dark spot occurs in all subpixels SP_21, SP_22, SP_23 and SP_24 of a second transparent pixel P2.

In a repair method of repairing a pixel electrode PE structure illustrated in FIG. 25, the pixel electrode structure is not a structure where a pixel electrode PE is partitioned, and thus, when a dark spot defect occurs in a subpixel SP, it is unable to repair the subpixel SP.

However, when a dark or hot spot defect occurs in the subpixel SP due to a defect of a transistor T connected to the pixel electrode PE, the subpixel SP may be repaired identically to a partitioned pixel electrode PE.

Therefore, FIG. 25 is a diagram for describing a repair method and a repaired state when a defect (a hot spot or a dark spot caused by short circuit) occurs in the transistor T provided in each of the subpixels SP_21, SP_22, SP_23 and SP_24 of the second transparent pixel P2.

In FIG. 25, a repair method of repairing a first subpixel SP_21 and a second subpixel SP_22 which are adjacent to each other in a first direction in the second transparent pixel P2 and share two different repair lines RL and a repair method of repairing a third subpixel SP_23 and a fourth subpixel SP_24 which are adjacent to each other in the first direction in the second transparent pixel P2 and share two different repair lines RL may be the same as the above-described repair method of repairing the first subpixel SP_21 and the second subpixel SP_22 of the second transparent pixel P2 illustrated in FIG. 23, and thus, their detailed descriptions are not repeated.

Even when a hot spot or a dark spot occurs in all subpixels disposed in one transparent pixel due to a defect which occurs in a transistor T included in each of all the subpixels, a driving current may be supplied from subpixels of two transparent pixels which are adjacent to each other in a second direction with a transparent area TA therebetween.

As described above, according to the embodiments of the present invention, the transparent display panel 110 and the transparent display device 100 which are high in transparency are provided.

Moreover, according to the embodiments of the present invention, the transparent display panel 110 and the transparent display device 100 which have the transparent pixel structure are provided.

Moreover, according to the embodiments of the present invention, a repair structure and a repair treatment method which are suitable for the transparent pixel structure are provided.

Moreover, according to the embodiments of the present invention, the transparent display panel 110 and the transparent display device 100, for which repair has been performed, are provided.

Moreover, according to the embodiments of the present invention, the transparent display panel 110 and the transparent display device 100 which are high in yield rate are provided.

As described above, according to the embodiments of the present invention, a transparent display panel and a transparent display device which are high in transparency are provided.

Moreover, according to the embodiments of the present invention, a transparent display panel and a transparent display device which have a transparent pixel structure are provided.

Moreover, according to the embodiments of the present invention, a repair structure and a repair treatment method which are suitable for a transparent pixel structure are provided.

Moreover, according to the embodiments of the present invention, a transparent display panel and a transparent display device, for which repair has been performed, are provided.

Moreover, according to the embodiments of the present invention, a transparent display panel and a transparent display device which are high in yield rate are provided.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A transparent display panel, comprising:
a plurality of data lines and a plurality of gate lines on a substrate;
a plurality of transparent pixels each including a plurality of subpixels, which display different colors and are disposed adjacent to each other in a first direction, and a transparent area disposed adjacent to a corresponding plurality of subpixels in a second direction; and
a repair line overlapping a first transparent pixel and a second transparent pixel adjacent to each other in the second direction in the plurality of transparent pixels,
wherein each of the plurality of subpixels adjacent to each other in the first direction includes a reflective layer on the repair line, a pixel electrode on the reflective layer, an organic layer on the pixel electrode, a common electrode on the organic layer, and an encapsulation layer on the common electrode,
wherein the transparent area adjacent to the corresponding plurality of subpixels in the second direction includes the organic layer on the substrate, the common electrode on the organic layer, and the encapsulation layer on the common electrode,
wherein the repair line comprises:
a first repair line part overlapping at least one of a plurality of pixel electrodes included in the first transparent pixel;
a second repair line part extending in the second direction outside a transparent area of the first transparent pixel; and
a third repair line part overlapping at least one of a plurality of pixel electrodes included in the second transparent pixel,
wherein the plurality of subpixels included in each of the plurality of transparent pixels each comprise a transistor and the pixel electrode, the pixel electrode including a first protrusion and a second protrusion which are located at opposite sides of the pixel electrode,
wherein the pixel electrode comprises:
a first part including the first protrusion, the first protrusion having a width narrower than a width of the pixel electrode;
a second part including the second protrusion, the second protrusion having a width narrower than the width of the pixel electrode; and
a connection part partitioning the pixel electrode into the first part and the second part,
wherein the connection part is directly connected with the first part and the second part of the pixel electrode.

2. The transparent display panel of claim 1, wherein two adjacent subpixels among the plurality of subpixels included in the transparent display panel have different colors.

3. The transparent display panel of claim 1, wherein transparent areas of two transparent pixels adjacent to each other in the first direction in the plurality of transparent pixels are disposed adjacent to each other.

4. The transparent display panel of claim 1, wherein:
the first repair line part is disposed under a second protrusion of a pixel electrode of the first transparent pixel and is overlapped with the first transparent pixel, and the third repair line part is disposed under a first protrusion of a pixel electrode of the second transparent pixel and is overlapped with the second transparent pixel.

5. The transparent display panel of claim 1, wherein:
the common electrode includes a transparent material, and
the transparent area of each of the plurality of transparent pixels comprises the organic layer and the common electrode including the transparent material.

6. The transparent display panel of claim 1, wherein:
if a number of subpixels included in each of the first and second transparent pixels is N number, each of the plurality of transparent pixels is divided into N−M (where N and M are natural numbers, and M<N) number of first subpixel groups and M number of second subpixel groups,
a repair line disposed under a second protrusion of a first subpixel group in the first transparent pixel is connected to a repair line disposed under a first protrusion of a first subpixel group in the second transparent pixel,
a repair line disposed under a second protrusion of a second subpixel group in the first transparent pixel is connected to a repair line disposed under a first protrusion of a second subpixel group in the second transparent pixel, and
the two repair lines are disconnected from each other.

7. The transparent display panel of claim 1, wherein two adjacent transparent pixels among the plurality of transparent pixels share one subpixel among a red subpixel, a green subpixel and a blue subpixel.

8. The transparent display panel of claim 7, wherein the two adjacent transparent pixels comprises a first color array having one color and a second color array having two colors different to each other.

9. The transparent display panel of claim 8, wherein:
the first color array have the green subpixel, and
the second color array have the red subpixel and the blue subpixel.

10. The transparent display panel of claim 9, wherein the two adjacent transparent pixels share the red subpixel or the blue subpixel in the second direction.

11. The transparent display panel of claim 1, wherein the pixel electrodes are anode electrodes.

12. A transparent display device, comprising:
a transparent display panel including a plurality of data lines and a plurality of gate lines on a substrate, a plurality of transparent pixels each including a plurality of subpixels which display different colors and are disposed adjacent to each other in a first direction and a transparent area disposed adjacent to a corresponding plurality of subpixels in a second direction, and a repair line overlapping a first transparent pixel and a second transparent pixel adjacent to each other in the second direction in the plurality of transparent pixels;
a data driver driving the plurality of data lines; and
a gate driver driving the plurality of gate lines,
wherein each of the plurality of subpixels adjacent to each other in the first direction includes a reflective layer on the repair line, a pixel electrode on the reflective layer, an organic layer on the pixel electrode, a common electrode on the organic layer, and an encapsulation layer on the common electrode,
wherein the transparent area adjacent to the corresponding plurality of subpixels in the second direction includes the organic layer on the substrate, the common electrode on the organic layer, and the encapsulation layer on the common electrode,
wherein the repair line comprises:
a first repair line part overlapping at least one of a plurality of pixel electrodes included in the first transparent pixel;
a second repair line part extending in the second direction outside a transparent area of the first transparent pixel; and
a third repair line part overlapping at least one of a plurality of pixel electrodes included in the second transparent pixel,
wherein the plurality of subpixels included in each of the plurality of transparent pixels each comprise a transistor and a pixel electrode, the pixel electrode including a first protrusion and a second protrusion,
wherein the pixel electrode comprises:
a first part including the first protrusion, the first protrusion having a width narrower than a width of the pixel electrode;
a second part including the second protrusion, the second protrusion having a width narrower than the width of the pixel electrode; and
a connection part partitioning the pixel electrode into the first part and the second part,
wherein the connection part is directly connected with the first part and the second part of the pixel electrode,
wherein the first protrusion and the second protrusion are located at opposite sides of the pixel electrode.

13. A repairing method for a transparent display panel, the transparent display panel comprises a plurality of data lines and a plurality of gate lines on a substrate, and a plurality of transparent pixels each including a plurality of subpixels, which display different colors and are disposed adjacent to each other in a first direction, and a transparent area disposed adjacent to a corresponding plurality of subpixels in a second direction, wherein the plurality of subpixels included in each of the plurality of transparent pixels each comprise a transistor and a pixel electrode, the repairing method comprising:
disposing a repair line overlapping a first transparent pixel and a second transparent pixel adjacent to each other in the second direction in the plurality of transparent pixels,
wherein the repair line comprises:
a first repair line part overlapping at least one of a plurality of pixel electrodes included in the first transparent pixel;
a second repair line part extending in the second direction outside a transparent area of the first transparent pixel; and
a third repair line part overlapping at least one of a plurality of pixel electrodes included in the second transparent pixel,
wherein each of the plurality of subpixels adjacent to each other in the first direction includes a reflective layer on the repair line, a pixel electrode on the reflective layer, an organic layer on the pixel electrode, a common electrode on the organic layer, and an encapsulation layer on the common electrode,
wherein the transparent area adjacent to the corresponding plurality of subpixels in the second direction includes the organic layer on the substrate, the common electrode on the organic layer, and the encapsulation layer on the common electrode,
wherein the plurality of subpixels included in each of the plurality of transparent pixels each comprise a transistor and the pixel electrode, the pixel electrode including a first protrusion and a second protrusion, wherein the pixel electrode comprises:
  a first part including the first protrusion, the first protrusion having a width narrower than a width of the pixel electrode;
  a second part including the second protrusion, the second protrusion having a width narrower than the width of the pixel electrode; and
  a connection part partitioning the pixel electrode into the first part and the second part, and
wherein the connection part is directly connected with the first part and the second part of the pixel electrode,
wherein the first protrusion and the second protrusion are located at opposite sides of the pixel electrode; and
repairing a defective transparent pixel by disconnecting the pixel electrode of the defective transparent pixel from the transistor thereof and connecting the pixel electrode to the repairing line.

14. A display device comprising:
a plurality of data lines in a first direction on a substrate;
a plurality of gate lines in a second direction on the substrate;
a plurality of transparent pixels including a subpixel area having a plurality of subpixels which have a pixel electrode and are adjacent to each other in the first direction and a transparent area adjacent to the subpixel area in the second direction;
a repair line including a first repair line and a second repair line which are disconnected from each other simultaneously overlapping a first transparent pixel and a second transparent pixel which are adjacent to each other in the second direction;
wherein each of the plurality of subpixels adjacent to each other in the first direction includes a reflective layer on the repair line, a pixel electrode on the reflective layer, an organic layer on the pixel electrode, a common electrode on the organic layer, and an encapsulation layer on the common electrode,
wherein the transparent area adjacent to the corresponding plurality of subpixels in the second direction includes the organic layer on the substrate, the common electrode on the organic layer, and the encapsulation layer on the common electrode,
wherein each of the subpixels has a partition structure for performing repair where the pixel electrode is partitioned into a first part and a second part with respect to a connection part between the first part and the second part,
wherein the connection part is directly connected with the first part and the second part of the pixel electrode,
wherein the first part includes a first protrusion and the second part includes a second protrusion, the first protrusion overlaps a repair line on a side and the second protrusion overlaps a repair line on an opposite side in the second direction and the first part or the second part can be normally used by using various repair methods when a defect occurs in one of the first part and the second part so that a repair can be performed accurately and easily,
wherein the first protrusion and the second protrusion are located at opposite sides of the pixel electrode.

15. The display device of claim 14, wherein the repair line is connected to another transparent pixel via an outside of the transparent area in order for an aperture ratio of the transparent area not to be reduced.

16. The display device of claim 14, wherein the connection part is a cutting point which is to be cut for repair.

17. The display device of claim 14, wherein one of the first protrusion and the second protrusion is a cutting point and a welding point which is to be welded for repair.

18. The display device of claim 14, wherein the width of each of the first protrusion, the second protrusion and the connection part is narrower than a width of another part of the pixel electrode.

19. The display device of claim 14, wherein the first part is connected to a transistor of the subpixel.

20. The display device of claim 14, wherein the common electrode is made of a transparent material and is in the transparent area of each transparent pixel without the pixel electrode.

21. The display device of claim 20, wherein the organic layer is in the transparent area of each transparent pixel.

* * * * *